(12) United States Patent  
Maeda

(10) Patent No.: US 6,519,963 B2  
(45) Date of Patent: Feb. 18, 2003

(54) SEMICONDUCTOR EQUIPMENT AND REFRIGERATOR

(75) Inventor: Shigenobu Maeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/465,272

(22) Filed: Dec. 17, 1999

(65) Prior Publication Data

US 2002/0100286 A1 Aug. 1, 2002

(30) Foreign Application Priority Data

Jun. 17, 1999 (JP) .......................................... 11-171198

(51) Int. Cl.[7] .............................. F25D 23/12; H03L 7/06
(52) U.S. Cl. ...................... 62/259.2; 326/93; 327/146; 331/46
(58) Field of Search ............................. 62/259.2, 337; 327/147, 156; 331/46, 48; 326/93

(56) References Cited

U.S. PATENT DOCUMENTS

| | | | | |
|---|---|---|---|---|
| 5,432,468 A | * | 7/1995 | Moriyama et al. | 327/152 |
| 5,467,465 A | * | 11/1995 | Chen | 395/550 |
| 5,485,127 A | * | 1/1996 | Bertoluzzi et al. | 331/69 |
| 5,706,668 A | * | 1/1998 | Hilpert | 62/259.2 |
| 5,758,132 A | * | 5/1998 | Strahlin | 395/556 |
| 5,798,667 A | * | 8/1998 | Herbert | 327/513 |
| 6,047,248 A | * | 4/2000 | Georgiou et al. | 702/132 |
| 6,138,469 A | * | 10/2000 | Davidson et al. | 62/259.2 |

FOREIGN PATENT DOCUMENTS

| JP | 5-288456 | 11/1993 |
|---|---|---|
| JP | 6-68114 | 3/1994 |

OTHER PUBLICATIONS

Extract from the Japan Economic Newspaper, "Nihon Keizai Shinbun", Sep.12, 1998, p. 33.

Glossary: Contrivance of Machinery, "Refrigerator", published by Kodansha Co., Ltd., pp. 82–85.

Neil H.E. Weste and Kamran Eshraghian, "Principles of CMOS VLIS Design, A Systems Perspective", Second Edition, pp. 685–689.

* cited by examiner

*Primary Examiner*—William Wayner  
(74) *Attorney, Agent, or Firm*—Oblon, Spivak, McClelland, Maier & Neustadt, P.C.

(57) ABSTRACT

A freezer (106) is provided with a connector (120) and connected to a semiconductor equipment (10). The connector (120) may include a connector for power supply (120a), a connector for data communication (120b) and a connector for analog signal (120c). Therefore, the semiconductor equipment (10) can transmit data and signal to the outside while being cooled in the freezer (106). With this constitution, a semiconductor equipment housed in a cooling system for high-speed operation and a refrigerator for cooling the semiconductor equipment are provided.

5 Claims, 32 Drawing Sheets

F I G. 5
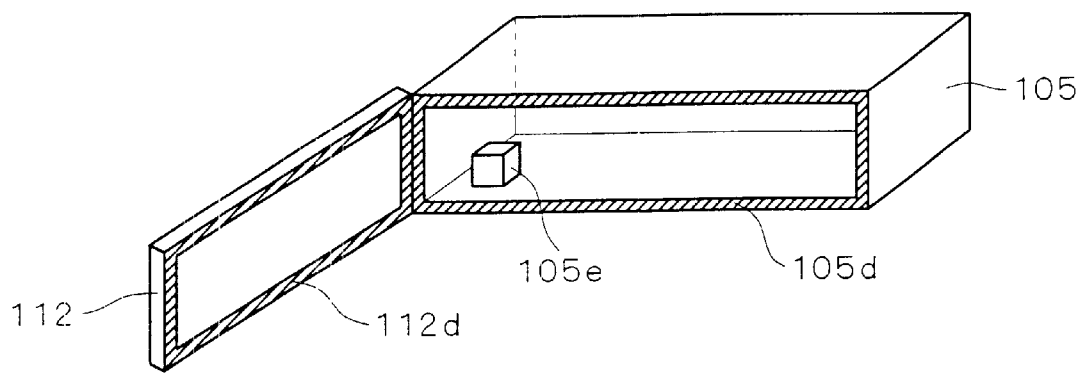
F I G. 6
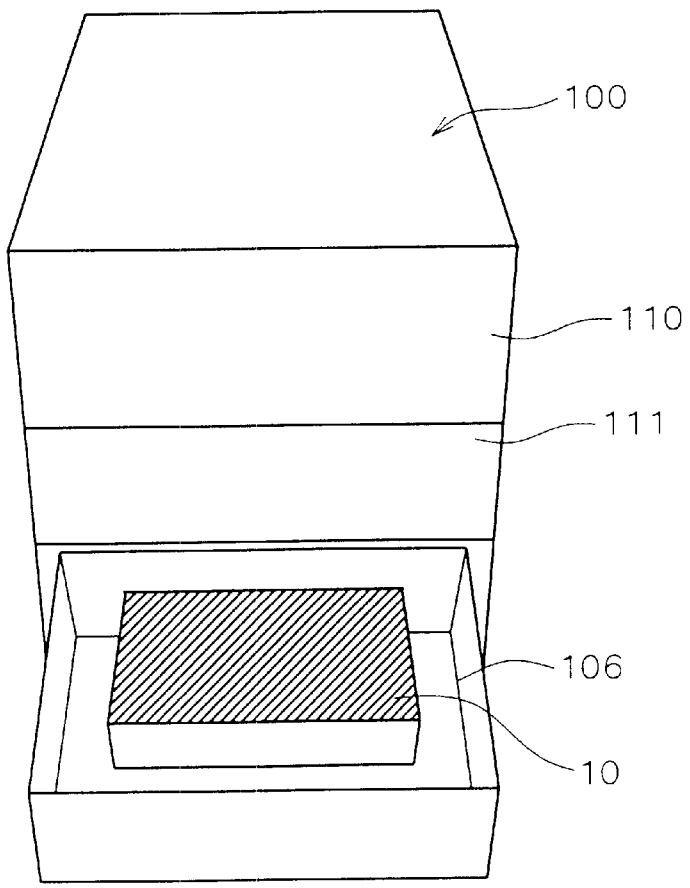

F I G. 9
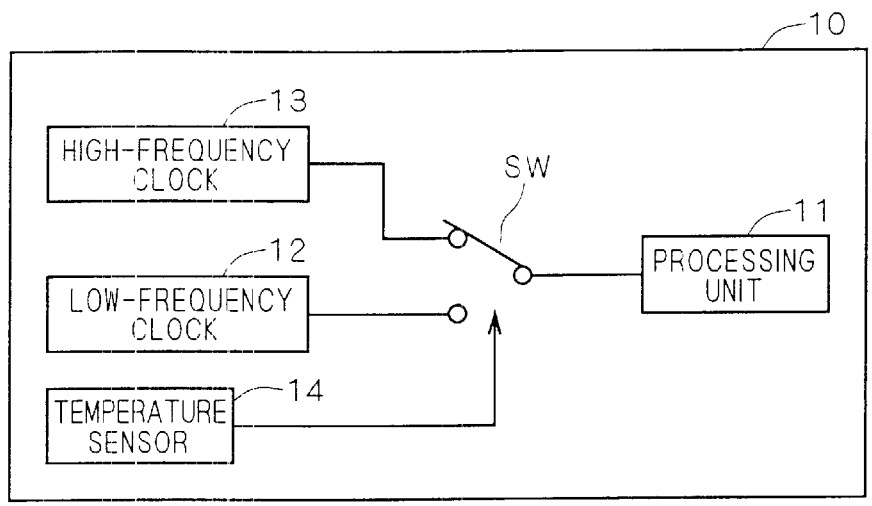
F I G. 10
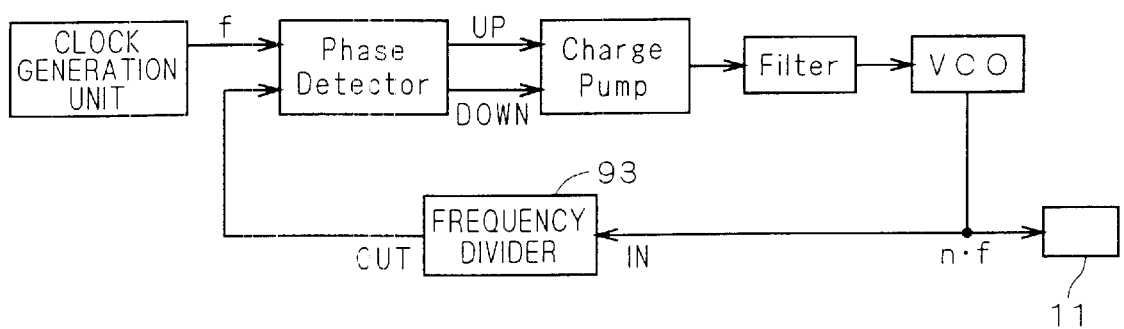

Q1

| NAME OF FOOD | (PUTTING-IN DATE) STORAGE DATE | WEIGHT | NUMBER | OPEN DATE | DATE FOR USE |
|---|---|---|---|---|---|
| BEEF | 1999·2·10 | 300 g | —— | 1999·2·13 | 1999·2·11 DINNER |
| PORK | 1999·2·10 | 100 g | —— | 1999·2·13 | 1999·2·12 LUNCH |
| MILK | 1999·2·10 | 4 ℓ | 4 | 1999·2·15 | —— |
| RADISH | 1999·2·10 | 500 g | —— | 1999·2·20 | 1999·2·12 BREAKFAST |
| ⋮ | ⋮ | ⋮ | ⋮ | ⋮ | ⋮ |

SEMICONDUCTOR EQUIPMENT AND REFRIGERATOR

BACKGROUND OF THE INVENTION

1. Field of the Invention

The present invention relates to a semiconductor equipment housed in a cooler and a refrigerator for cooling the semiconductor equipment.

2. Description of the Background Art

In general, a semiconductor device operates faster at low temperature. For carriers are less vulnerable to scattering, increasing mobility, at low temperature. To operate the semiconductor device at low temperature, however, a special high-cost cooling system (e.g., a cooling system using liquid nitrogen) is required, so this has not been prevalent. Therefore, the semiconductor device is used mainly at room temperature.

In the semiconductor device used at room temperature, a flowing current causes heating to raise temperature, deteriorating mobility, and consequently the operating speed of the semiconductor device decreases.

On the other hand, a refrigerator at home is used only for cooling foods. FIG. 52 is an external view showing a constitution of a background-art refrigerator 900. A refrigerator compartment 901 mainly houses beverages, dairy products, eggs and the like. A freezer 904 houses meets, ice and the like. The refrigerator compartment 901 is provided with a door 910 and the freezer 904 is provided with a door 911. Drawer compartments 902 and 903 each house vegetables and the like.

It is disadvantageous that the foods housed in the refrigerator 900 can be checked only when the door 910 or 911 is opened or the drawer compartment 902 or 903 is drawn.

SUMMARY OF THE INVENTION

The present invention is directed to a semiconductor equipment. According to a first aspect of the present invention, the semiconductor equipment comprises: clock generation means for generating a first clock and a second clock having a frequency higher than that of the first clock; and a processing unit operating on the basis of either one of the first and second clocks and having a semiconductor device.

According to a second aspect of the present invention, the semiconductor equipment of the first aspect further comprises a switch for switching between the first and second clocks depending on temperature to transmit one of them to the processing unit.

According to a third aspect of the present invention, the semiconductor equipment comprises: a phase locked loop circuit receiving a reference clock having a reference frequency, for multiplying the reference frequency to generate a multiple clock, and making an alignment in phase between a divided result of the multiple clock by a predetermined value and the reference clock; and a processing unit operating on the basis of the multiple clock and having a semiconductor device. In the semiconductor equipment of the third aspect, the predetermined value becomes larger as the temperature becomes lower.

The present invention is also directed to a refrigerator. According to a fourth aspect of the present invention, the refrigerator comprises: a refrigerator compartment for housing foods; and a freezer housing a semiconductor equipment using a semiconductor device and having connection means connected to the semiconductor equipment.

According to a fifth of the present invention, in the refrigerator of the fourth aspect, the freezer is a drawer compartment, and the semiconductor equipment comprises an input/output media port facing an opening of the drawer compartment.

According to a sixth aspect of the present invention, in the refrigerator of the fifth aspect, the drawer compartment is drawable from a front side of the refrigerator and the opening is located on the front side of the refrigerator.

According to a seventh aspect of the present invention, the refrigerator of the fourth aspect further comprises the freezer exposing the input/output media port of the semiconductor equipment.

According to an eighth aspect of the present invention, the refrigerator of the fourth aspect comprises: second connection means provided on a front side of said refrigerator and connected to the connection means of the freezer.

According to a ninth aspect of the present invention, in the refrigerator of the fourth to eighth aspects, the semiconductor equipment is connected to input/output means of the semiconductor equipment through a network.

According to a tenth aspect of the present invention, the refrigerator of the fourth to ninth aspects houses a backup battery of the semiconductor equipment outside the freezer.

According to an eleventh aspect of the present invention, in the refrigerator of the fourth to tenth aspects, the semiconductor equipment uses an SOI device.

According to a twelfth aspect of the present invention, the refrigerator of the fourth aspect further comprises a refrigerator controller for controlling a function of the refrigerator. In the refrigerator of the twelfth aspect, the semiconductor equipment has a microprocessor, and the refrigerator controller is connected to the microprocessor with an input/output bus.

In the semiconductor equipment of the first aspect of the present invention, since the cooled semiconductor device with higher mobility can operate on the basis of the second clock, the operation can be performed by using the first clock at high ambient temperature and the second clock at low ambient temperature.

The semiconductor equipment of the second and third aspects of the present invention makes it possible to automatically increase the frequency of the operation clock of the semiconductor equipment to improve the operating speed thereof at low temperature.

The refrigerator of the fourth aspect of the present invention cools the semiconductor device without inhibiting connection of the semiconductor equipment with the outside to improve the operating speed of the semiconductor equipment.

In the refrigerator of the fifth and sixth aspects of the present invention, the freezer is the drawer compartment and the input/output medium can be easily brought in/out through its opening.

In the refrigerator of the seventh aspect of the present invention, the input/output medium can be brought into or out from the semiconductor equipment without opening the door of the freezer.

In the refrigerator of the eighth aspect of the present invention, the semiconductor equipment can be connected to the outside without a labor of moving the large-sized refrigerator.

In the refrigerator of the ninth aspect of the present invention, since an input/output operation can be performed on the external input/output means while the semiconductor equipment is housed in the refrigerator, it is possible to solve the problems that the semiconductor equipment can not be used because it is housed in the refrigerator and the semiconductor equipment can be used only the place where the refrigerator is installed, e.g., a kitchen.

In the refrigerator of the tenth aspect of the present invention, by housing the backup battery outside, which is likely to be deteriorated at low temperature, it is possible to lengthen the lifetime of the backup battery.

In the refrigerator of the eleven aspect of the present invention, by cooling the semiconductor equipment using the SOI device in which the heat is hard to radiate, it is possible to manifest the potential capability of high-speed operation of the SOI device.

In the refrigerator of the twelfth aspect of the present invention, the refrigerator controller which controls the function of the refrigerator can be controlled by the microprocessor of the semiconductor equipment.

An object of the present invention is to provide a semiconductor equipment housed in a cooler for faster operation and a refrigerator for cooling the semiconductor equipment.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 are conceptual diagrams showing the basic idea of the present invention;

FIGS. 9 and 10 are block diagrams showing variations of the configuration in accordance with the second preferred embodiment of the present invention;

DESCRIPTION OF THE PREFERRED EMBODIMENTS

A. Basic Idea

Figure 1:
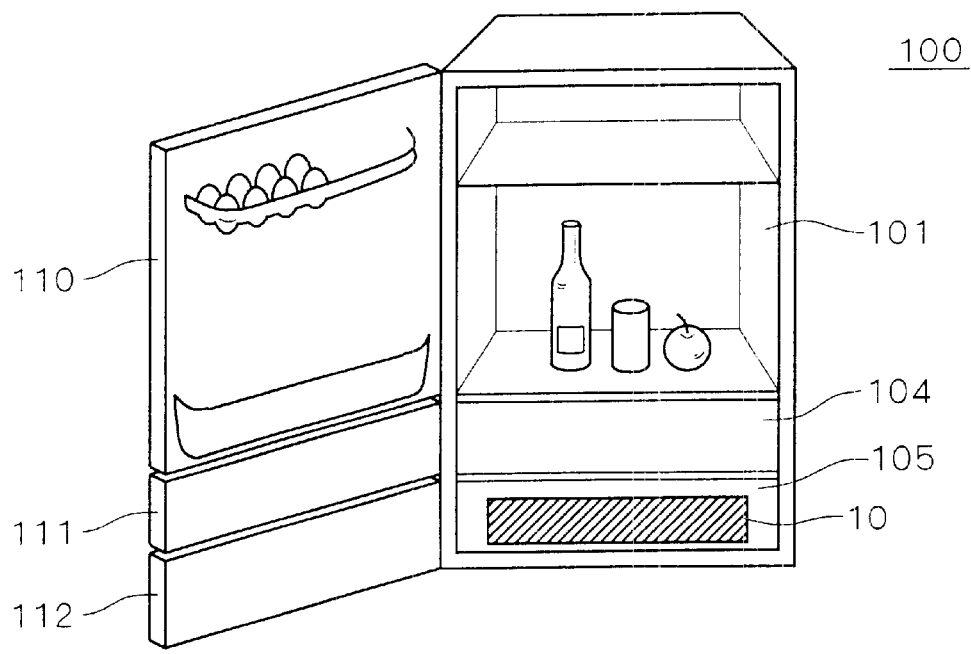
FIG. 1 is an external view showing a basic idea of the present invention.

FIG. 1 is an external view of a constitution of a refrigerator 100, showing a basic idea of the present invention.

The refrigerator 100 is provided with a refrigerator compartment 101 housing foods and the like, a freezer 104 housing ice and the like and a freezer 105 housing a semiconductor equipment 10 such as a personal computer. The semiconductor equipment 10 uses a semiconductor device. The refrigerator compartment 101 and the freezers 104 and 105 are provided with doors 110, 111 and 112, respectively. The freezers 104 and 105 are partitioned off each other. The freezer 105 is waterproofed and dry enough to prevent condensation. Housed in the freezer 105, the semiconductor device in the semiconductor equipment 10 operates at high speed.

When a normal semiconductor is used at room temperature, its inside temperature rises to about 100° C. by heating. In contrast, by sufficiently exhausting the heat in the freezer, the temperature of −20° C. can be achieved inside the semiconductor. Since the mobility of electrons is in proportion to −(3/2)th power of absolute temperature, the ratio of mobilities in the freezer and at room temperature is 1.79. Therefore, the semiconductor equipment 10 can operate faster in the freezer by 80% than at room temperature.

Figure 2:
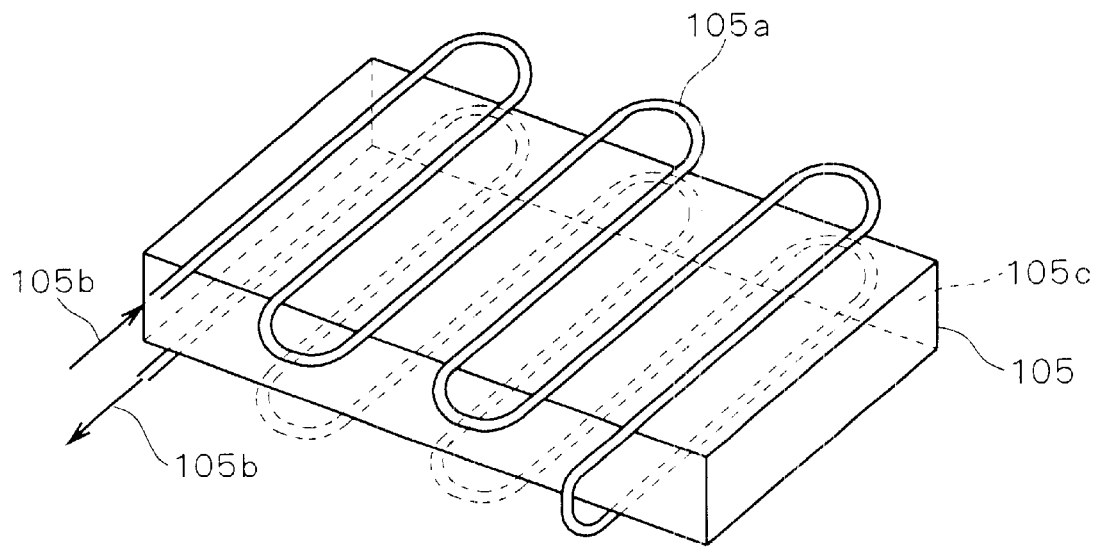
FIGS. 2 and 3 are conceptual diagrams showing the basic idea of the present invention.

FIG. 2 is a conceptual diagram showing a structure of the freezer 105. An evaporator 105a meanders around the freezer 105 except for an opening 105c on the side of the door, and a coolant gas 105b flows in the evaporator 105a. Adiabatic expansion of the coolant gas 105b cools the freezer 105. Such a structure only has to be one used for a general refrigerator, and both a compression-refrigerator and an absorption-refrigerator can cool the freezer 105. Furthermore, such methods as shown in "Glossary: Contrivance of Machine (Shojiten: Kikai no Shikumi)", pp. 82 to 85 (Shigeru Watanabe, Kodansha), herein incorporated by reference, may be adopted.

Figure 3:
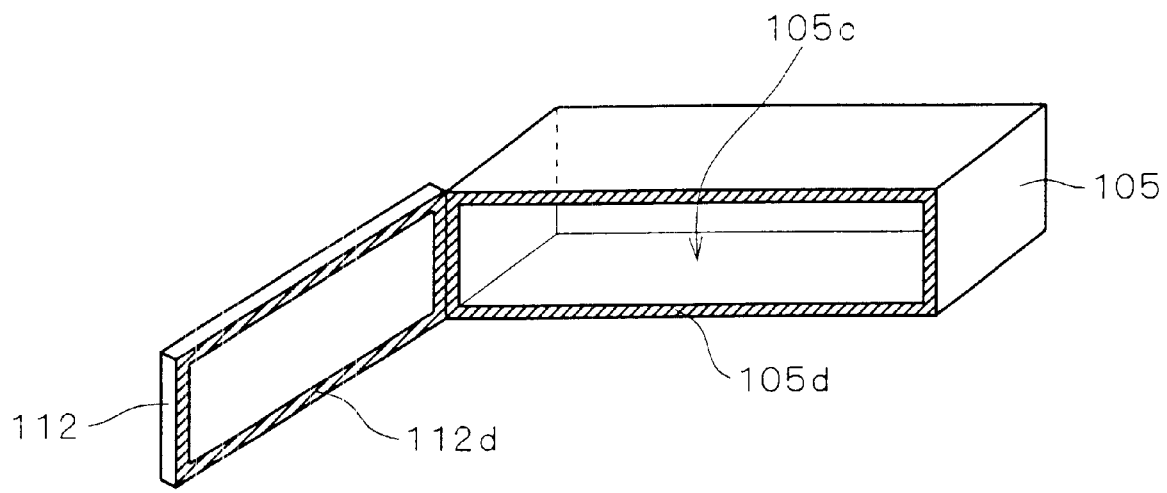

FIG. 3 is a conceptual diagram showing a waterproof structure of the freezer 105. A magnet packing 105d is provided around the opening 105c. On the face of the door 112 on the side of the opening 105c, a magnet packing 112d is provided to come into an intimate contact with the magnet packing 105d when the door 112 is closed.

Figure 4:
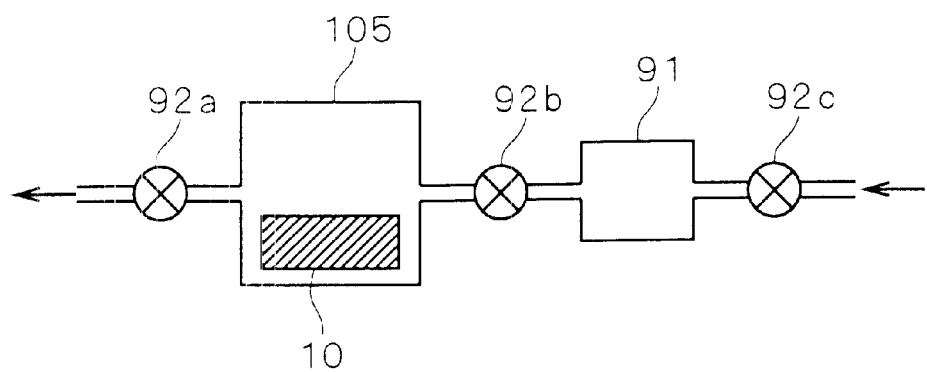
FIG. 4 is a block diagram showing the basic idea of the present invention.

FIG. 4 is a block diagram showing a mechanism to prevent condensation in the freezer 105. In front of the freezer 105, a condensation room 91 is located and the condensation room 91 inspires through an intake pump with valve 92c. The temperature is kept lower in the condensation room 91 than in the freezer 105. Since the saturation vapor pressure in the condensation room 91 is low, the air inspired therein is dried by condensation. The dried air is introduced to the freezer 105 through an intermediate valve 92b. Since temperature in the freezer 105 is higher than in the condensation room 91, no condensation is caused in the freezer 105. The freezer 105 is exhausted through an exhaust pump with valve 92a. It is sufficient to operate the intermediate valve 92b, the intake pump with valve 92c and the exhaust pump with valve 92a only when the freezer 105 is opened or closed to put the semiconductor equipment 10 therein. With the evaporator, as shown in FIG. 2, the inside temperature of the condensation room 91 can be lowered. By making the length of the evaporator with respect to its size relatively longer than that of the freezer 105, the temperature of the condensation room 91 becomes lower than that of the freezer 105.

FIG. 5 is a conceptual diagram showing another structure to prevent condensation. Since the partial pressure of steam in the freezer is reduced by disposing a desiccant 105e in the freezer 105, no condensation is caused even at low temperature.

Thus, according to the present invention, since a freezer in a refrigerator which seems to be possessed by any family is used for cooling, without a special cooling system such as liquid nitrogen, it is possible to enhance the performance of a semiconductor equipment at low cost.

FIG. 6 is a conceptual diagram showing a case where the refrigerator 100 comprises a drawer compartment 106 as a freezer for containing a semiconductor equipment 10. Although the drawer compartment 106 is the bottom stage in this figure, it may be located wherever, the middle stage or the top stage. The drawer compartment 106 may be provided with something for waterproof or to prevent condensation.

B. The Preferred Embodiments (b-1) The First Preferred Embodiment

Figure 7:
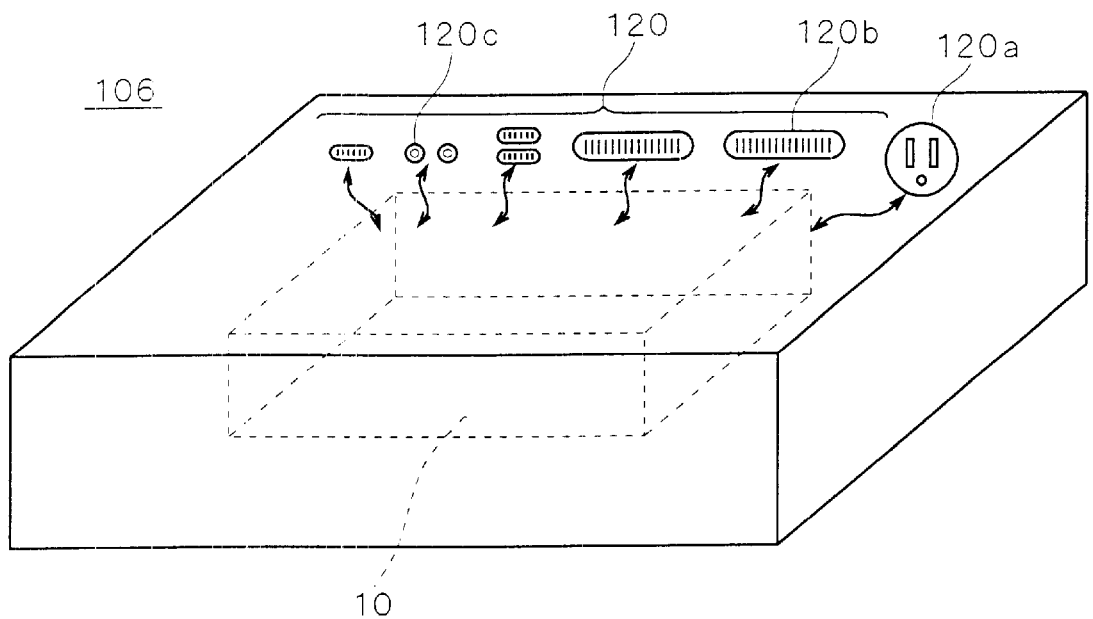
FIG. 7 is a conceptual diagram showing a constitution in accordance with a first preferred embodiment of the present invention.

FIG. 7 is a conceptual diagram showing a constitution of the freezer 106 in accordance with the first preferred embodiment of the present invention. The freezer 106 is provided with a connector 120 and connected to the semiconductor equipment 10 as indicated by arrows. The connector 120 may include a connector for power supply 120a, a connector for data communication 120b and a connector for analog signal 120c. Therefore, the semiconductor equipment 10 can be supplied with power and communicate data and signals with the outside while being cooled in the freezer 106.

(b-2) The Second Preferred Embodiment

Since a personal computer usually operates on the basis of a clock, it can not operate at high speed if a clock frequency does not increase even at low temperature. Then prepared are two clocks, a first clock of low frequency with which the semiconductor equipment 10 can operate even at room temperature and a second clock of high frequency with which the semiconductor equipment 10 properly operates when being cooled.

Figure 8:
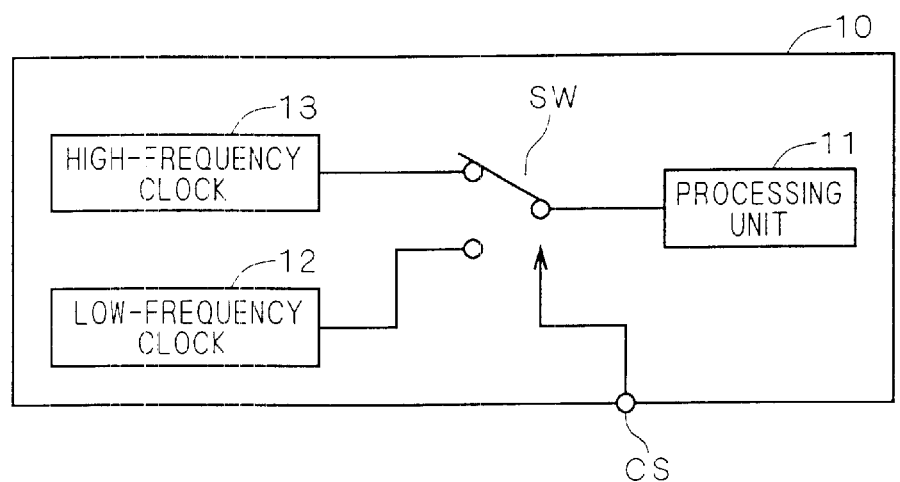
FIG. 8 is a block diagram showing a configuration in accordance with a second preferred embodiment of the present invention.

FIG. 8 is a block diagram showing a configuration of the semiconductor equipment 10 with a plurality of clocks as above. The semiconductor equipment 10 comprises a processing unit 11 having a semiconductor device, a clock generation unit 12 for generating the first clock and a clock generation unit 13 for generating the second clock. With switching operation of a switch SW, either the first or second clock is applied to the processing unit 11. The switching operation of the switch SW can be externally controlled by a signal through a switching terminal CS. Instead of the switching terminal CS, a manual control may be externally made on the switching operation of the switch SW.

When the semiconductor equipment 10 is used outside, the first clock is selected, and when used at home, the semiconductor equipment 10 is cooled in the freezer and the second clock is selected for faster operation.

FIG. 9 is a block diagram showing a variation of this preferred embodiment. The switch SW is controlled neither manually nor by external input, but by a temperature sensor 14 incorporated in the semiconductor equipment 10. The temperature sensor 14 performs the switching operation of the switch SW as above depending on ambient temperature. This eliminates some complicated operation for switching the clock.

FIG. 10 is a block diagram showing another configuration for switching the clock. The clock generation unit generates a reference clock signal of frequency f and inputs the reference clock signal to a phase detector. The phase detector detects a phase shift between the reference clock signal and an output from a frequency divider 93, generates an up signal UP and a down signal DOWN and applies these two signals to a charge pump. An output from the charge pump is applied a voltage control oscillator (VCO) through a filter. The applied signal is multiplied into the frequency n·f and the multiplied clock signal is applied to the processing unit 11. The same multiplied signal is also applied to the frequency divider 93, where divided into frequency f, and outputted. A phase locked loop as above is made to stably obtain a clock signal of frequency n·f. This phase locked loop is well known, and introduced in detail in, for example, "Principles of CMOS VLSI Design (2nd Edition)" pp. 685 to 689 by Neil H. E. Weste and Kamran Eshraghian, Addison Wesley, herein incorporated by reference.

Figure 11:
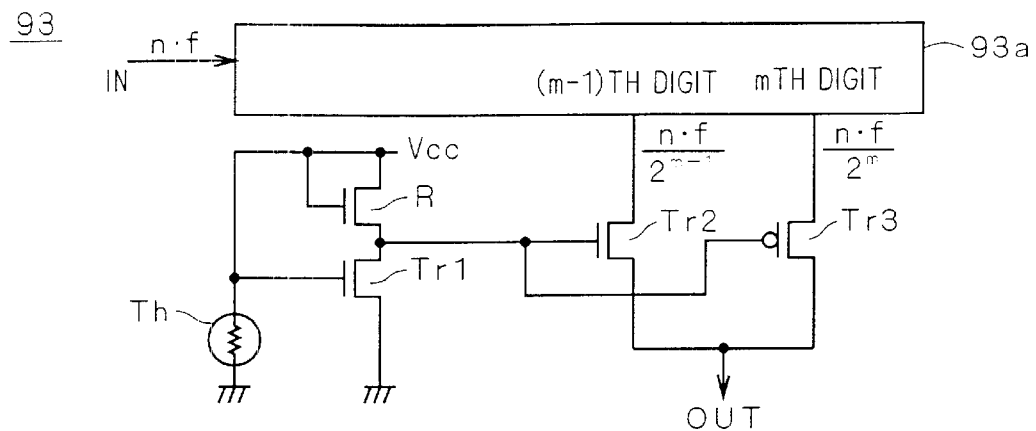
FIG. 11 is a circuit diagram showing a variation of the configuration in accordance with the second preferred embodiment of the present invention.

FIG. 11 is a circuit diagram illustrating a configuration of the frequency divider 93. The frequency divider 93 comprises a $2^m$ counter 93a, a thermistor TH, n-type transistors Tr1 and Tr2 and a p-type transistor Tr3. One electrode of the transistor Tr2 receives an (m–1)th-digit output from the $2^m$ counter 93a and one electrode of the transistor Tr3 receives an m-th-digit output. Other electrodes of the transistors Tr2 and Tr3 are connected in common, to output a divided signal. Gates of the transistors Tr2 and Tr3 are connected to a ground through the transistor Tr1 and pulled up to a power supply Vcc through a resistor R (achieved by, for example, a diode connection of transistors as shown in this figure). A gate of the transistor Tr1 is connected to the power supply Vcc and further connected to the ground through the thermistor Th.

In the configuration of FIG. 11, as the temperature sensed by the thermistor Th rises, the resistance value of the thermistor Th decreases. Therefore, threshold values of the transistors Tr1, Tr2 and Tr3 can be controlled so that over a certain temperature, the transistors Tr1, Tr2 and Tr3 may turn on, off and on, respectively and under the temperature, the transistors Tr1, Tr2 and Tr3 may turn off, on and off, respectively. Accordingly, the frequency divider 93 divides the clock signal outputted from the voltage control oscillator by $2^{m-1}$ over a certain temperature and by $2^m$ under the temperature. Since the clock signal outputted from the frequency divider 93 is matched in phase with the clock signal of frequency f by the phase locked loop, the frequency n·f of the clock signal outputted from the voltage control oscillator rises from $2^{m-1} \cdot f$ to $2^m \cdot f$ by a factor of 2 as the temperature falls.

Though this preferred embodiment has been discussed mainly taking a personal computer as an example, application of this preferred embodiment is not restricted to the personal computer. A semiconductor equipment to perform an application needing high-speed operation, such as an image processing using MPEG, can produce the same effect.

(b-3) The Third Preferred Embodiment

Figure 12:
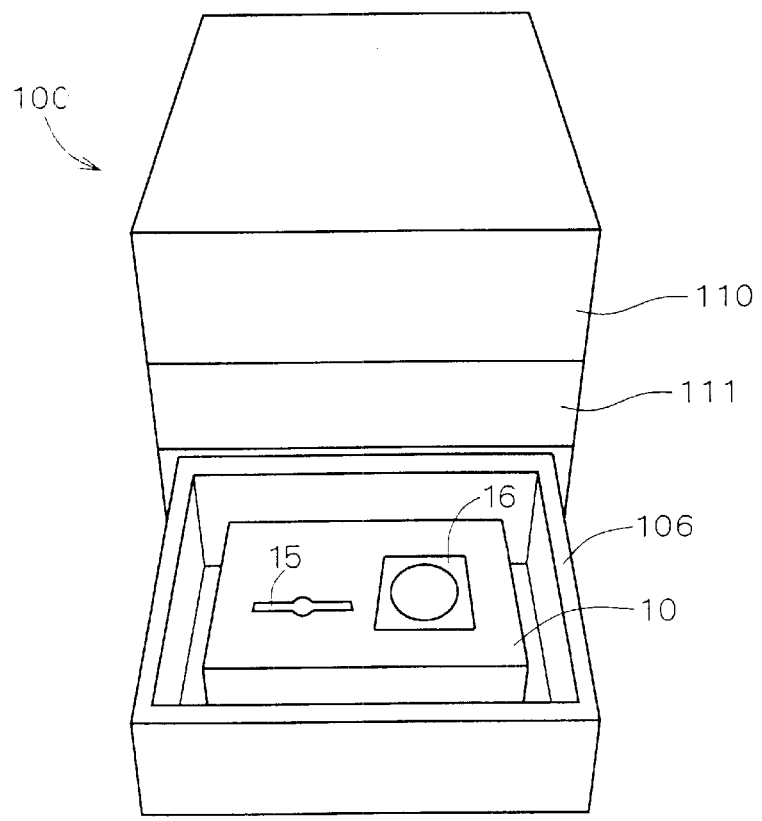
FIG. 12 is an external view showing a constitution in accordance with a third preferred embodiment of the present invention.

FIG. 12 is an external view of the third preferred embodiment of the present invention, showing a case where the refrigerator 100 comprises the drawer compartment 106 as a freezer, like the case of FIG. 6.

When the semiconductor equipment 10 is housed in the drawer compartment 106 as shown in this figure, it is desirable to provide media ports 15 and 16 at locations exposed on the side of opening of the drawer compartment 106 in the semiconductor equipment 10. Since the drawer compartment 106 is opened upwards in FIG. 12, it is desirable to provide the media ports 15 and 16 on an upper surface of the semiconductor equipment 10, in terms of convenience for bringing a medium (input/output medium) in/out. The media ports 15 and 16 are used for bringing, for example, a floppy disk and a CD-ROM in/out, respectively.

Figure 13:
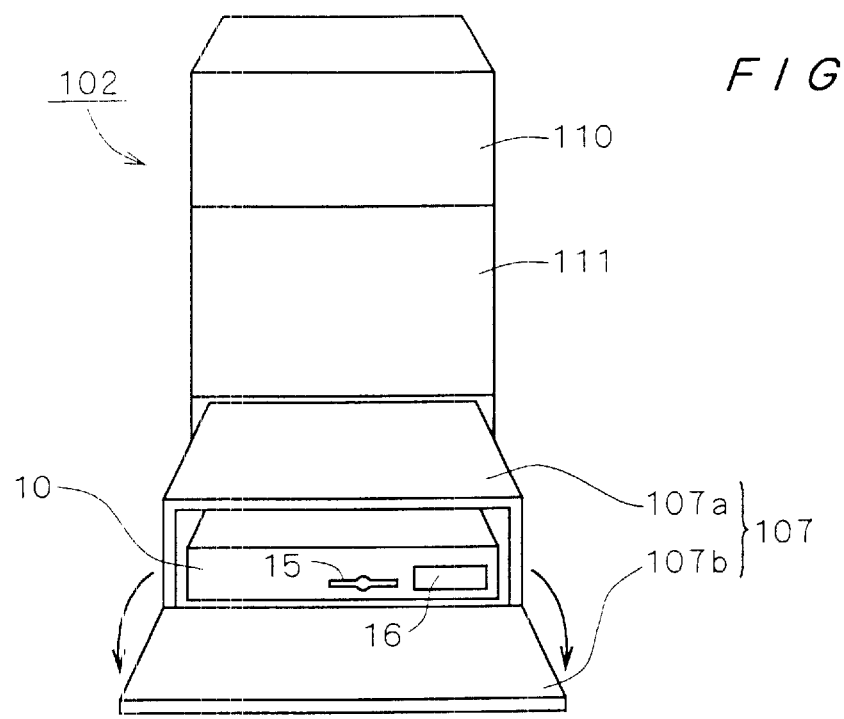
FIG. 13 is an external view showing a variation of the constitution in accordance with the third preferred embodiment of the present invention.

FIG. 13 is an external view of a variation of this preferred embodiment, showing a case where a refrigerator 102 comprises a drawer compartment 107 as a freezer. The drawer compartment 107 has a body 107a and a door 107b. When the door 107b is opened in a direction as indicated by arrows, the body 107a is opened. An opening of the body 107a is located on the same side as other doors 110 and 111 of the refrigerator 102 are located, i.e., on a front side of the refrigerator 102. It is naturally desirable to provide the connector 120 of FIG. 7 in the drawer compartment 107, like in the drawer 106.

Also when the semiconductor equipment 10 is housed in the drawer compartment 107 of this preferred embodiment, it is desirable to provide the media ports 15 and 16 in the semiconductor equipment 10 in terms of convenience for bringing a medium in/out. In this case, it is desirable to provide the media ports 15 and 16 on the front side of the semiconductor equipment 10 like an ordinal semiconductor equipment.

Though the media ports for floppy disk and CD-ROM are discussed, the preferred embodiment can be similarly applied for other media such as DVD-ROM and MO.

(b-4) The Fourth Preferred Embodiment

Figure 14:
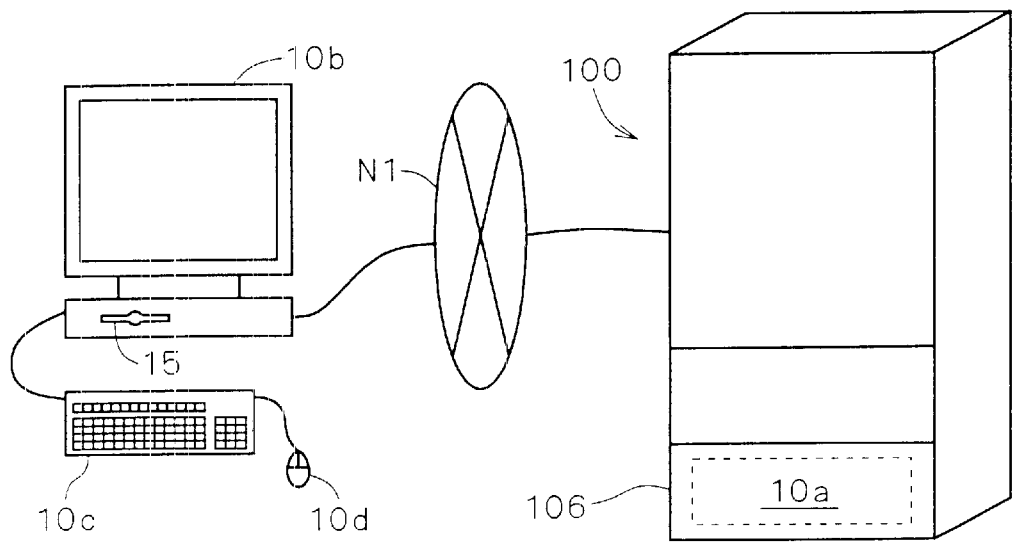
FIG. 14 is an external view showing a component in accordance with a fourth preferred embodiment of the present invention.

FIG. 14 is an external view of the fourth preferred embodiment of the present invention, showing a case where the refrigerator 100 comprises the drawer compartment 106 as a freezer, like the case of FIG. 6. The drawer compartment 106 of the refrigerator 100 houses a body 10a of a personal computer and the body 10a is connected to a home network N1 through the connector 120 of FIG. 7. On the other hand, the home network N1 is connected to a display 10b, a keyboard 10c and a mouse 10d of the personal computer directly or indirectly. Therefore, the body 10a of the personal computer and the input/output devices 10b, 10c and 10d are connected to each other through the home network N1.

Thus, since input/output operation can be made with the input/output devices 10b, 10c and 10d provided away from the refrigerator 100, problems such as the display 10b and the keyboard 10c can not be used because they are in the refrigerator and the semiconductor equipment 10 can be used only in a place where the refrigerator is installed, e.g., in a kitchen.

(b-5) The Fifth Preferred Embodiment

Figure 15:
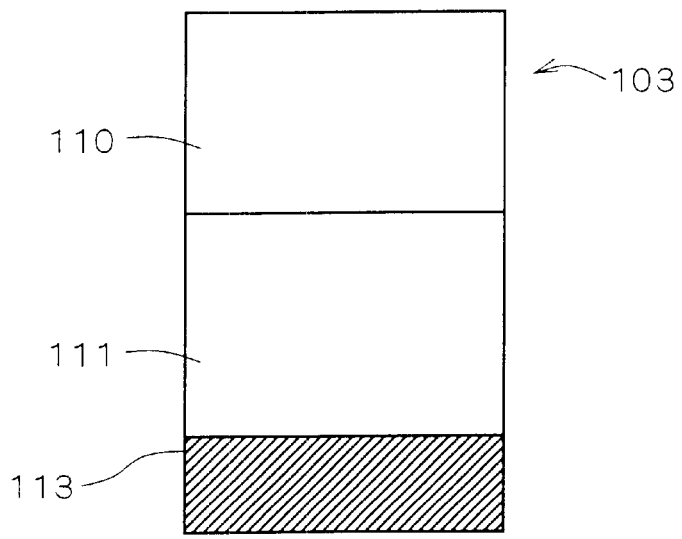
FIGS. 15 and 16 are external views showing constitutions in accordance with a fifth preferred embodiment of the present invention.

FIG. 15 is an external view showing the fifth preferred embodiment of the present invention. A refrigerator 103 comprises a not-shown refrigerator compartment openable/closable with the doors 110 and 111 and a dedicated freezer 113. The dedicated freezer 113 is used only for housing the semiconductor equipment 10 to cool it, ordinarily having no mechanism to open/close. It is naturally desirable to provide a mechanism to open/close for maintenance and inspection.

Figure 16:
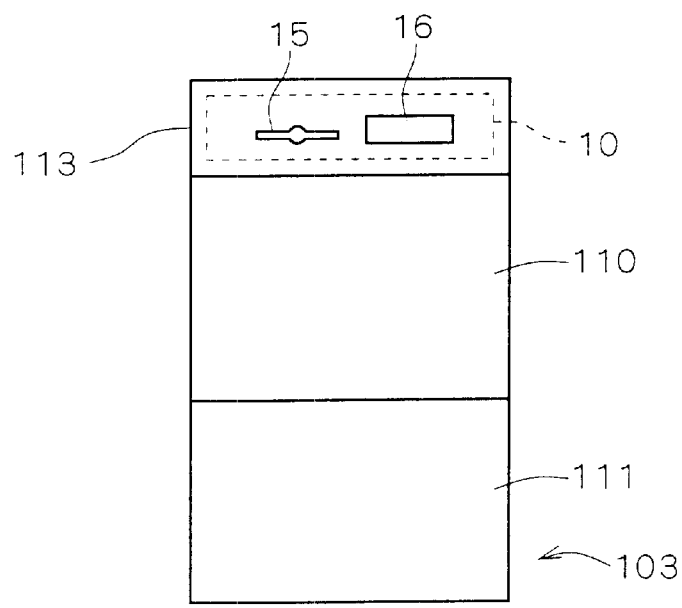

FIG. 16 is an external view showing a more preferable example of this preferred embodiment. The dedicated freezer 113 exposes the media ports 15 and 16 of the semiconductor equipment 10. It thereby becomes possible to bring a medium into or out from the semiconductor equipment 10 without opening the dedicated freezer 113. It is desirable to provide the media ports 15 and 16 on the same side as the doors 100 and 111 are provided, as shown in this figure, in terms of operability.

Figure 17:
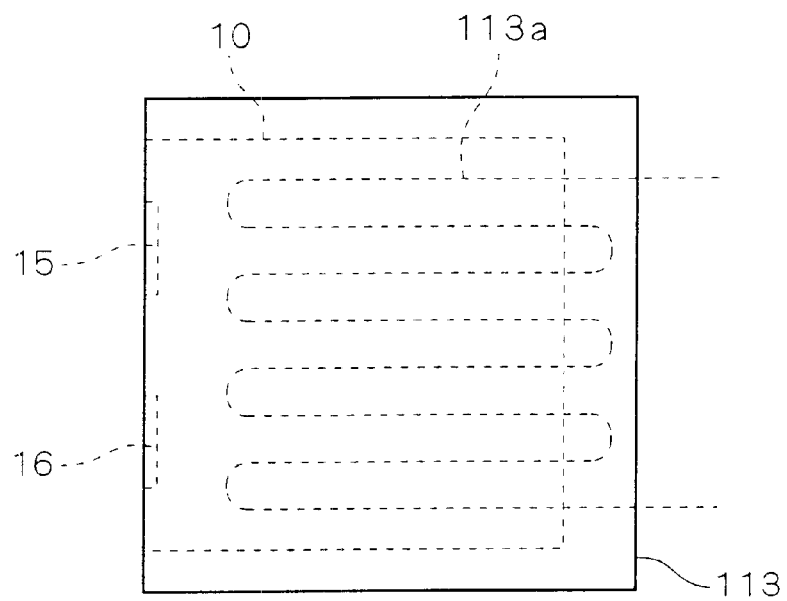
FIG. 17 is a plan view showing a structure in accordance with the fifth preferred embodiment of the present invention.

FIG. 17 is a plan view illustrating a structure of the dedicated freezer 113. like the freezer 105, an evaporator 113a is disposed around the dedicated freezer 113.

Figure 18:
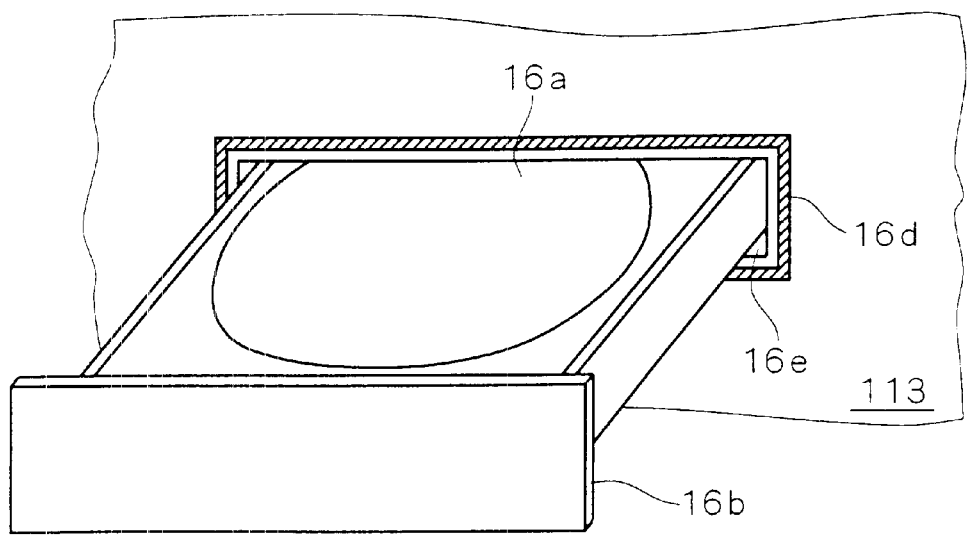
FIG. 18 is a perspective view showing a constitution in accordance with the fifth preferred embodiment of the present invention.

FIG. 18 is a perspective view illustrating a constitution of the media port 16 used as a media port for CD-ROM. The media port 16 comprises a tray for CD-ROM 16a, an opening 16e and a door 16b. The tray for CD-ROM 16a can be brought into or out from the dedicated freezer 113 through the opening 16e. The door 16b is fixed to the tray for CD-ROM 16a, covering the opening 16e when the tray for CD-ROM 16a is housed in the dedicated freezer 113.

Figure 19:
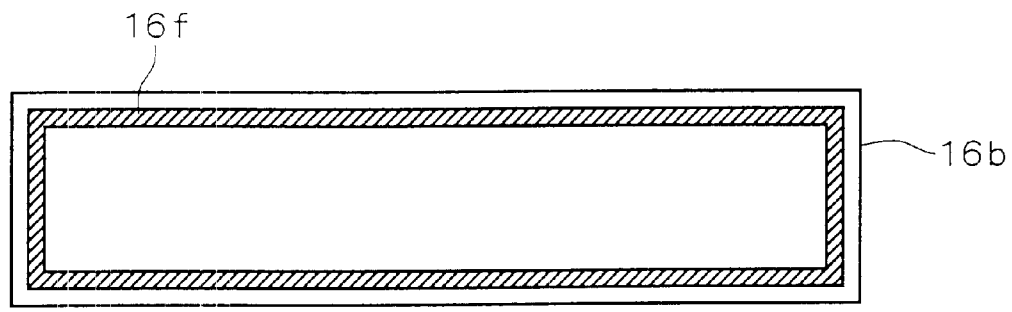
FIG. 19 is an elevation view showing a constitution in accordance with the fifth preferred embodiment of the present invention.

FIG. 19 is an elevation viewing the door 16b from the side of the opening 16e. A packing 16f is provided around the door 16b and seals the opening 16e with a packing 16d located around the opening 16e correspondingly. Thus, there is no disadvantage of losing the function of cooling the semiconductor equipment 10 by the dedicated freezer 113 through the media port 16.

Naturally, this constitution can be applied to a media port for floppy disk.

Further, as shown in FIG. 16, it is desirable to provide the dedicated freezer 113 at the top of the refrigerator 103 because the media ports 15 and 16 are easily handled.

(b-6) The Sixth Preferred Embodiment

Figure 20:
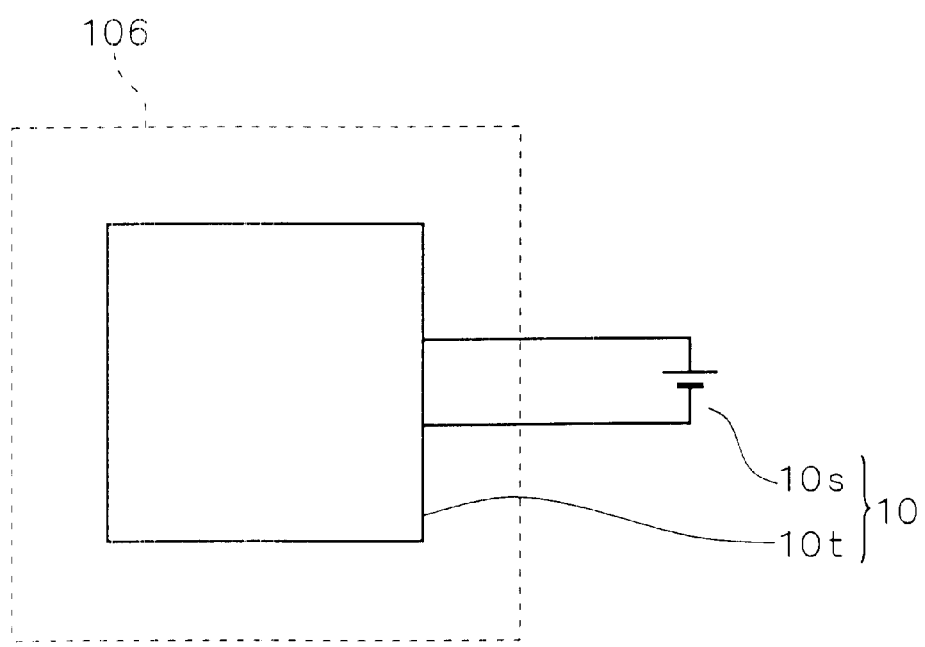
FIG. 20 is a block diagram showing an idea in accordance with a sixth preferred embodiment of the present invention.

FIG. 20 is a block diagram showing an idea in accordance with the sixth preferred embodiment of the present invention. In many cases, the semiconductor equipment 10 comprises a backup battery 10s. In general, the lifetime of battery is considerably deteriorated at low temperature.

For this reason, part 10t of the semiconductor equipment 10 other than the backup battery 10s is housed in the freezer 106 to be cooled and the backup battery 10s is located outside the freezer 106 not to be cooled. This lengthens the lifetime of the backup battery 10s, to eliminate labors for frequent change of the backup battery and gain advantage in cost.

Figure 21:
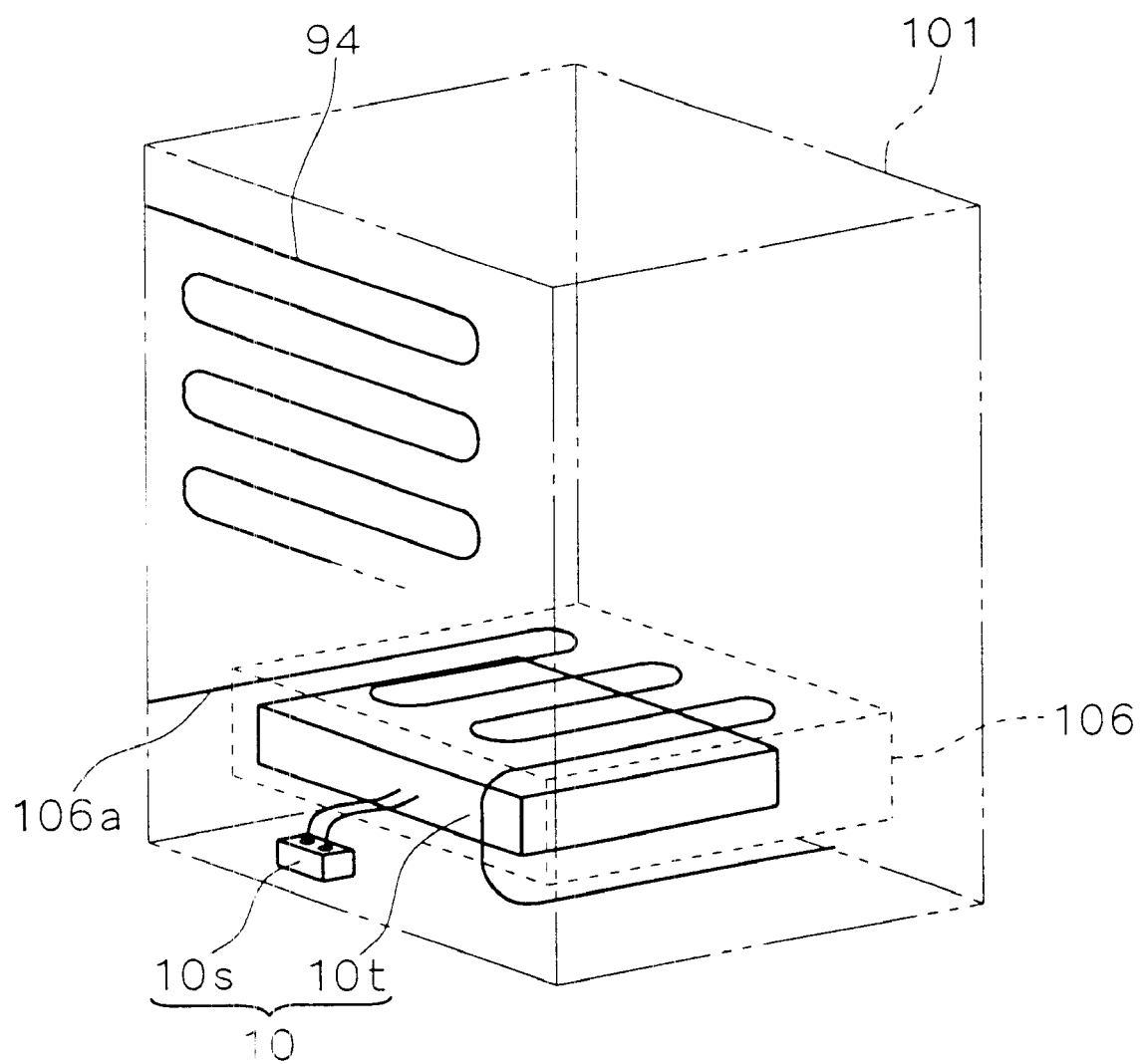
FIG. 21 is a perspective view showing a structure in accordance with the sixth preferred embodiment of the present invention.

FIG. 21 is a perspective view illustrating this preferred embodiment. In this figure, for better viewability, an outline of the refrigerator 101 is represented by chain line, the freezer 106 in the refrigerator 101 is represented by broken line and an evaporator 106a and a condenser 94 in the freezer 106 and the part 10t of the semiconductor equipment 10 housed in the freezer 106 are represented by solid line.

The refrigerator 101 usually comprises the condenser 94 for condensing the coolant gas and around it, the temperature is high. Therefore, it is desirable to locate the backup battery 10s near it for longer lifetime of the backup battery 10s.

(b-7) The Seventh Preferred Embodiment

Figure 22:
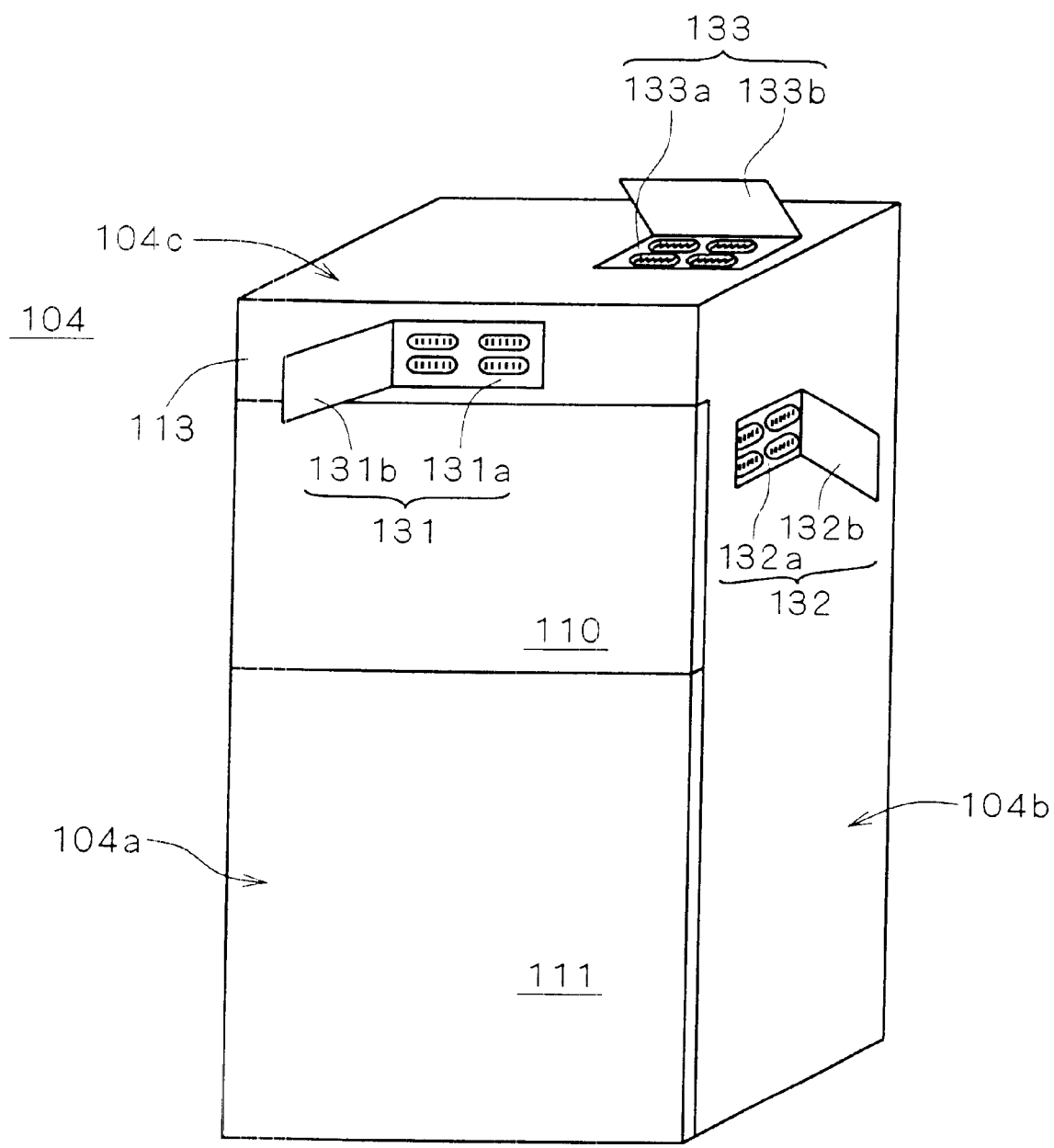
FIG. 22 is an external view showing a constitution in accordance with a seventh preferred embodiment of the present invention.

FIG. 22 is a perspective view showing an appearance of a refrigerator 104 in accordance with the seventh preferred embodiment of the present invention. The doors 110 and 111 are disposed on a front surface 104a of the refrigerator 104 and above that, the dedicated freezer 113 is disposed.

The refrigerator 104 is provided with a connector unit at least on one of the front surface 104a, a side surface 104b and an upper surface 104c. In FIG. 22, connector units 131, 132 and 133 are disposed on the front surface 104a, the side surface 104b and the upper surface 104c, respectively.

The connector units 131, 132 and 133 have connectors 131a, 132a and 133a, respectively, which are connected to the semiconductor equipment 10 through e.g., the connector 120 of FIG. 7 inside the refrigerator 104. It is naturally desirable that the connector units 131, 132 and 133 are provided with covers 131b, 132b and 133b, respectively, for protection from dust.

According to this preferred embodiment, without moving a large-sized refrigerator, the semiconductor equipment housed therein can be easily connected to the outside. For example, easy connection can be made between the home network N1 of FIG. 14 in the fourth preferred embodiment and the semiconductor equipment 10.

(b-8) The Eighth Preferred Embodiment

Figure 23:
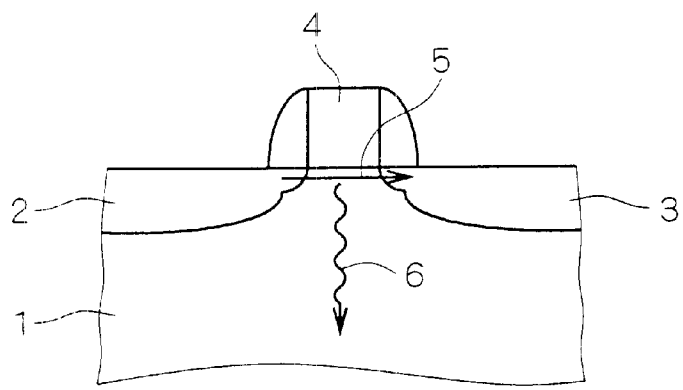
FIGS. 23 and 24 are cross sections for explanation of an eighth preferred embodiment of the present invention.
Figure 24:
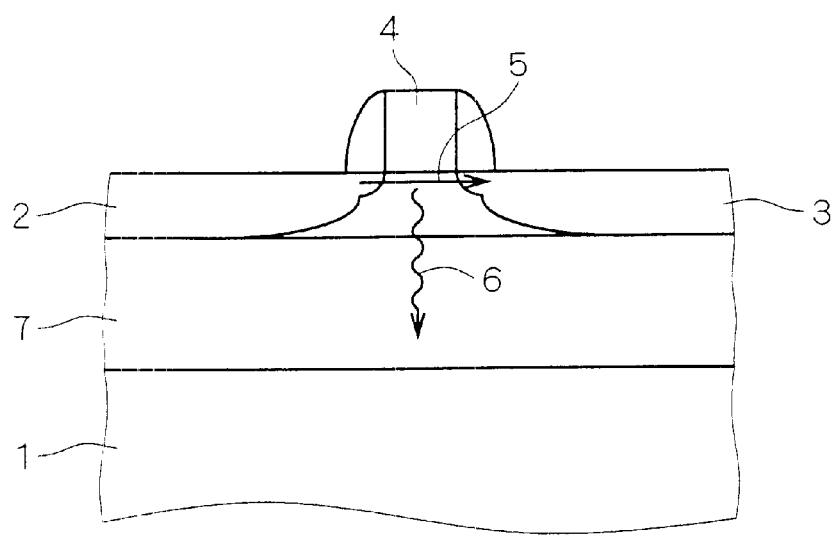

FIGS. 23 and 24 are cross sections used for explanation of this preferred embodiment, showing MOS transistors as examples of bulk device and SOI device, respectively. In both MOS transistors, a current 5 flows from a source 2 to a drain 3 by potential control of a gate 4, generating a heat 6. The heat 6 is easy to vent to a semiconductor substrate 1 in the bulk device while the heat 6 is blocked by a silicon oxide 7, not being vented, in the SOI device. Therefore, using the SOI device is preferable to using the bulk device for the semiconductor equipment 10 (or the body 10a, or the part 10t) to be cooled. For it is possible to manifest potential capability of high-speed operation of the SOI device.

(b-9) The Ninth Preferred Embodiment

Figure 25:
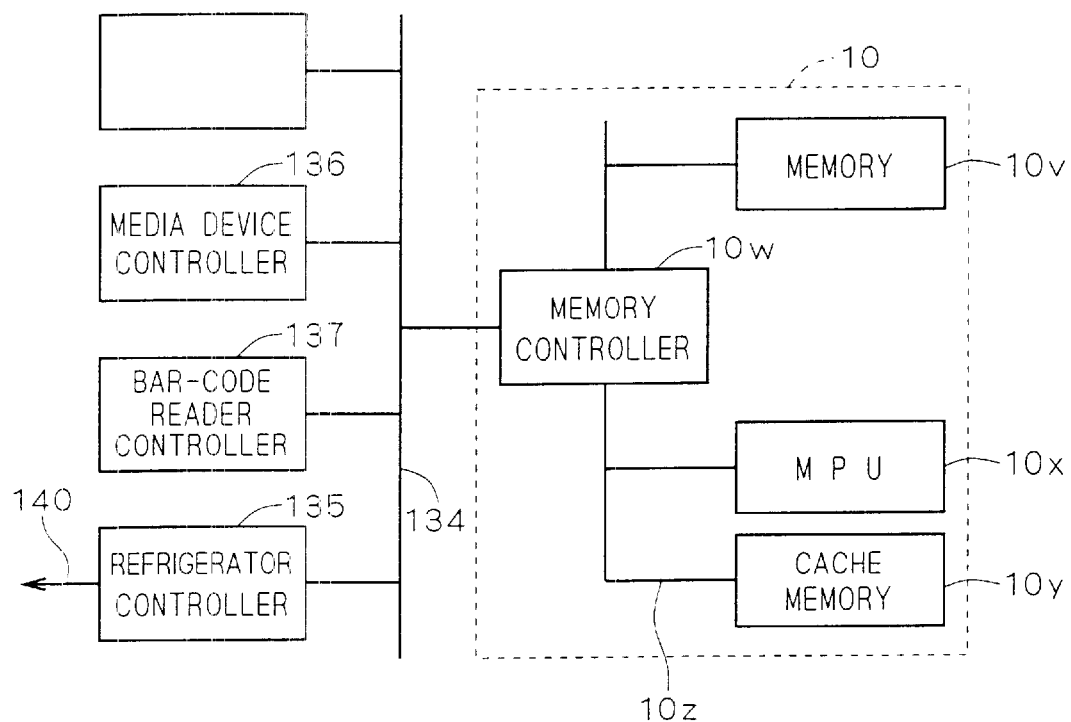
FIG. 25 is a block diagram for explanation of a ninth preferred embodiment of the present invention.

FIG. 25 is a block diagram showing this preferred embodiment. The semiconductor equipment 10 comprises a memory 10v, a memory controller 10w, microprocessor (MPU) 10x, a cache memory 10y and a memory bus 10z. The memory controller 10w is connected to an I/O bus 134 which is connected to a controller 135 of the refrigerator and a media device controller 136. The controller 135 of the refrigerator outputs an instruction 140 to control functions of the refrigerator, e.g., the cooling speed and time for keeping temperature and the like. The media device controller 136 controls devices for performing writing/reading of media to input/output data into/from the semiconductor equipment 10.

According to this preferred embodiment, since the semiconductor equipment 10 and the controller 135 of the refrigerator share the I/O bus 134, the operation of the refrigerator can be controlled more freely with the microprocessor 10x of the semiconductor equipment 10. Further, since the semiconductor equipment 10 and the refrigerator share peripherals such as CD-ROM and hard disk, it is possible to reduce cost for high-speed operation.

The above preferred embodiments can be achieved not only alone but also in combination. For example, the sixth preferred embodiment may be with one of the first to fifth preferred embodiments, and further the combination may be combined with the seventh preferred embodiment.

C. Basic Idea of Applications

For example, by connecting the I/O bus 134 further to other controller such as a bar-code reader controller 137 to apply a bar-code reader to the refrigerator, such operations as shown in the following applications can be achieved.

In the conventional refrigerator, what are contained inside can be observed only when the refrigerator is opened. In a refrigerator, however, housing the semiconductor equipment 10 to control foods therein, a bar-code reader controlled by the semiconductor equipment 10 is attached, by which a database can be made regarding foods put in and out from the refrigerator. Therefore, it is not necessary to open the door for checking what are contained in the refrigerator, the door has only to be opened/closed when the foods are put in and out from the refrigerator.

Figure 26:
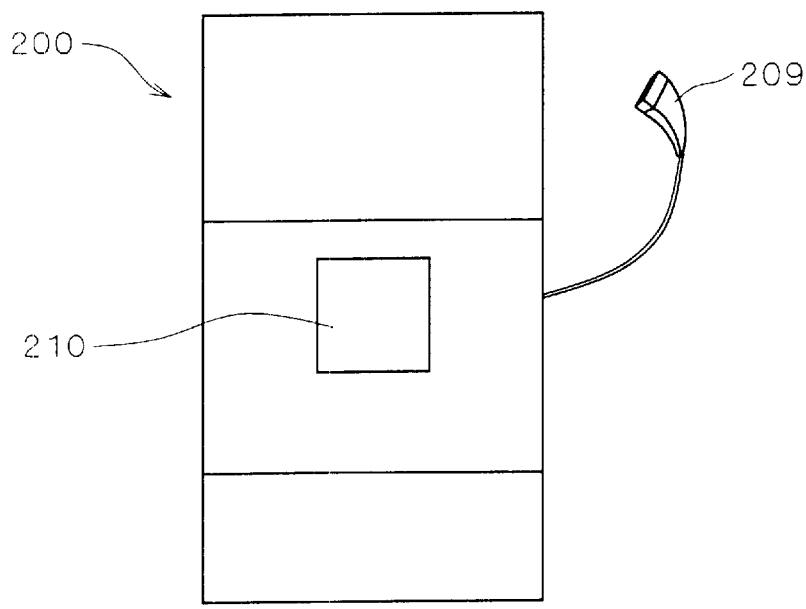
FIG. 26 is a conceptual diagram showing a constitution to which a basic idea of an application of the present invention is applied.

FIG. 26 is a conceptual view showing a constitution of a refrigerator 200 to which the basic idea of the present application is applied. An LCD display 210 is attached on a front surface of the refrigerator 200 and a handheld bar-code reader 209 is provided separately from the body. For example, by connecting a controller for controlling the LCD display 210 to the I/O bus 134 of FIG. 25, The LCD display 210 can be controlled under direction of the microprocessor 10x.

When the foods are put in the refrigerator 200, the bar codes of the foods are read by the bar-code reader 209 and stored together with date into the semiconductor equipment 10 such as a personal computer (putting-in operation). The bar-code reader 209 is controlled by the bar-code reader controller 137. When the foods are put out, the bar codes of the foods are read by the bar-code reader 209 and stored into the semiconductor equipment 10 (putting-out operation). Thus, a list of foods in the refrigerator can be made semi-automatically. It is desirable to display the foods put into or out from the refrigerator on the LCD display 210 for check when the foods are put in or out.

The bar code refers to a code to uniquely specify country, maker, name for each item, e.g., JAN (Japanese Article Number). It is natural that other code system may be used only if can distinguish what are contained in the refrigerator. A technique in which the bar-code reader is applied to the refrigerator is disclosed in Japanese Patent Application Laid Open Gazette No. 5-288456.

Since that makes it possible to grasp contents of the refrigerator with the database, various functions as discussed later can be applied to the refrigerator. The database may be kept in the semiconductor equipment 10 or outside the refrigerator through the home network N1 as shown in the fourth preferred embodiment.

It is desirable for the semiconductor equipment 10 to be cooled in the refrigerator 200, but regardless of a judgment is made on whether being cooled or not, it is desirable to be incorporated in the refrigerator. Naturally, the bar-code reader 209 of the refrigerator 200 may be externally controlled.

Figure 27:
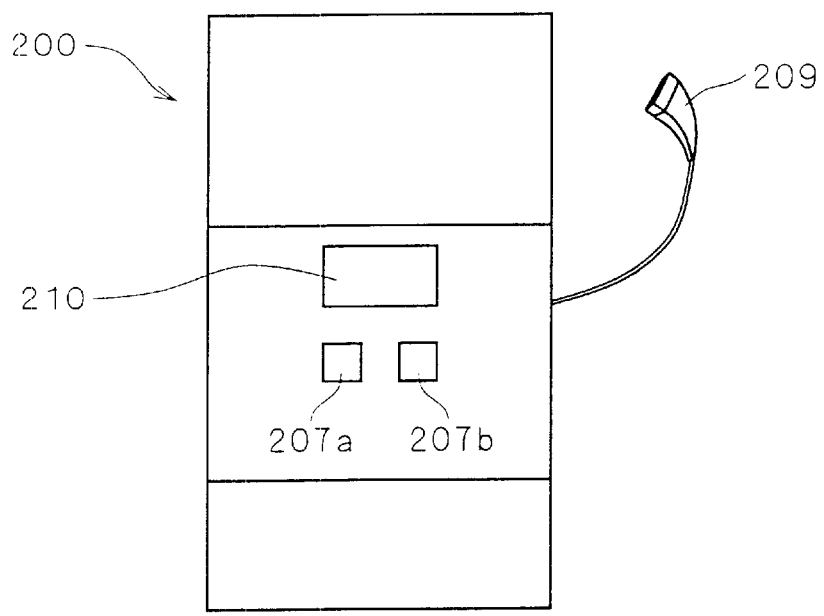
FIG. 27 is a conceptual diagram showing another constitution to which the basic idea of the application of the present invention is applied.

FIG. 27 is a conceptual diagram showing another constitution of the refrigerator 200. To distinguish putting-in and putting-out of foods, a putting-in button 207a and a putting-out button 207b are provided. For example, when the bar-code reader 209 reads the bar codes while pushing the putting-in button 207a, it is grasped that the foods with the bar codes are put in, and when the bar-code reader 209 reads the bar codes while pushing the putting-out button 207b, it is grasped that the foods given the bar codes are put out. This means that a control by separately using the putting-in button 207a and the putting-out button 207b for each food is adopted.

Another control may be performed to grasp that the foods with the bar codes read by the bar-code reader 209 from the time when the putting-in button 207a is once pushed until the time when the putting-out button 207b is next pushed should be put in the refrigerator 200, and the foods with the bar codes read by the bar-code reader 209 from the time when the putting-out button 207b is once pushed until the time when the putting-in button 207a is next pushed should be put out from the refrigerator 200.

Further, there may be a case where the bar codes for a plurality of foods are read by the bar-code reader 209 without pushing the putting-in button 207a or the putting-out button 207b and the names of the foods are listed on the LCD display 210. In this case, such a control can be made, where specifying the displayed foods, the putting-in button 207a or the putting-out button 207b is pushed to separate put-in foods and put-out foods and their data are stored into the database.

Figure 28:
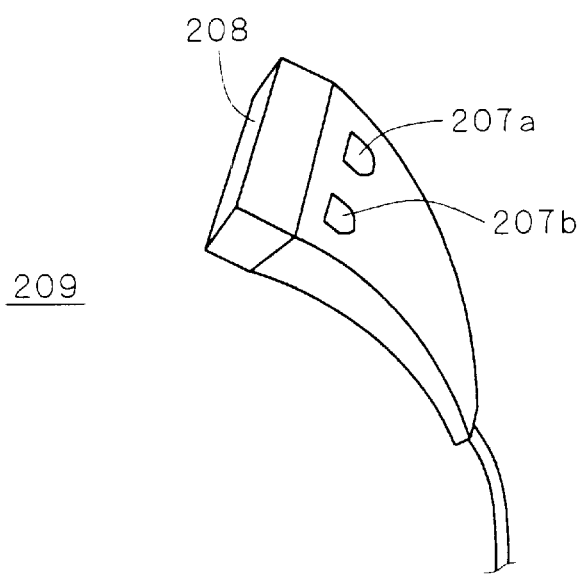
FIG. 28 is a conceptual diagram showing a constitution to which the basic idea of an application of the present invention is applied.

FIG. 28 is a conceptual diagram illustrating a constitution of the bar-code reader 209. The bar-code reader 209 comprises a bar-code reading face 208, the putting-in button 207a and the putting-out button 207b. By incorporating the putting-in button 207a and the putting-out button 207b in the bar-code reader 209, it becomes easier to perform an operation of reading the bar code with the bar-code reading face 208 while pushing the putting-in button 207a, for example.

Further, as one of ways of using the refrigerator, there is a case where the food once put out therefrom is used a little and the rest of it is often put therein again. To cope with this case, it is desirable to provide a partial-use button together with the putting-in button 207a and the putting-out button 207b. For example, the bar code of a food once put out is read while the partial-use button is pushed, and the food is partially used and then put in the refrigerator again. That makes it possible to grasp this food as "remainder", which are partially used.

(C-1) The First Application

Figure 29:
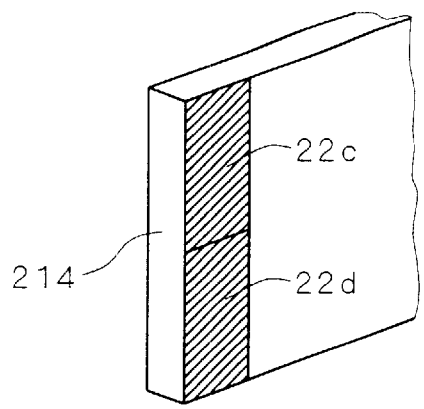
FIG. 29 is a conceptual diagram showing a constitution in accordance with a first application of the present invention.

FIG. 29 is a conceptual diagram showing a constitution of this application. A door 214 of the refrigerator 200 comprises a putting-in bar-code reader 22c and a putting-out bar-code reader 22d on its inner side.

Thus, using different bar-code readers for putting-in and putting-out, a database on the putting-in and putting-out for the refrigerator 200 is easily made. Naturally, a bar-code reader for partial-use may be also provided.

(C-2) The Second Application

Figure 30:
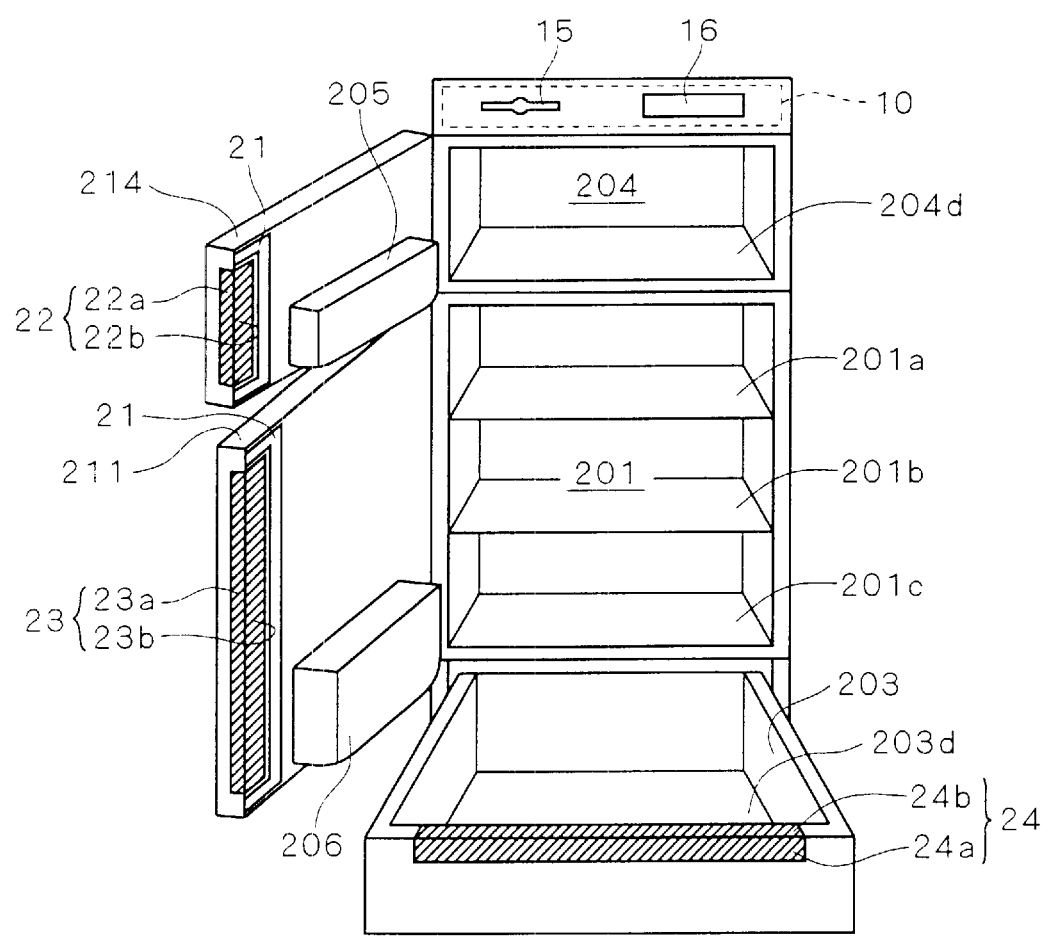
FIGS. 30 to 32 are conceptual diagrams showing constitutions in accordance with a second application of the present invention.

FIG. 30 is a conceptual diagram illustrating this application. This figure shows a state where a refrigerator compartment 201, a freezer 204 and a drawer compartment 203 of the refrigerator 200 are opened.

The refrigerator 200 is provided with the cooled semiconductor equipment 10 in its upper portion. The media ports 15 and 16 of the semiconductor equipment 10 are exposed to the refrigerator 200.

The refrigerator compartment 201 and the freezer 204 are exposed by opening doors 211 and 214, respectively. Bar-code readers 23 and 22 are provided at edges on the opposite side of a rotary shaft for opening/closing of the doors 211 and 214. The bar-code reader 23 has an external reading face 23a and an internal reading face 23b. The external reading face 23a is exposed outside the refrigerator 200 even when the door 211 is closed while the inner reading face 23b is covered by the refrigerator compartment 201 when the door 211 is closed. Similarly, the bar-code reader 22 has an external reading face 22a and an internal reading face 22b. The external reading face 22a is exposed outside the refrigerator 200 even when the door 214 is closed while the inner reading face 22b is cover ed by the freezer 204 when the door 214 is closed.

Similarly, th e drawer compartment 203 has a bar-code reader 24 with an external reading face 24a and an internal reading face 24b on this side of its opening. The external reading face 24a is exposed outside the refrigerator 200 even when the drawer compartment 203 is closed while the inner reading face 24b is not exposed to the refrigerator 200 when the drawer compartment 203 is closed.

By providing the bar-code readers 23, 22 and 24 on part of the doors 211 and 214 and the drawer compartment 203, e.g., near handles, the operations of opening the refrigerator 200, holding foods over the bar-code readers and putting the foods into or out from the refrigerator 200 are successively performed, to achieve high efficiency.

Especially, by providing the external reading faces 23a, 22a and 24a, the bar codes for foods can be read without opening the refrigerator 200. Further, vegetable not in sack, home-made vegetable and hooked fish have no bar code. In these cases, after putting the foods into the refrigerator 200, separately-prepared bar codes can be read by the external reading faces 23a, 22a and 24a.

Figure 31:
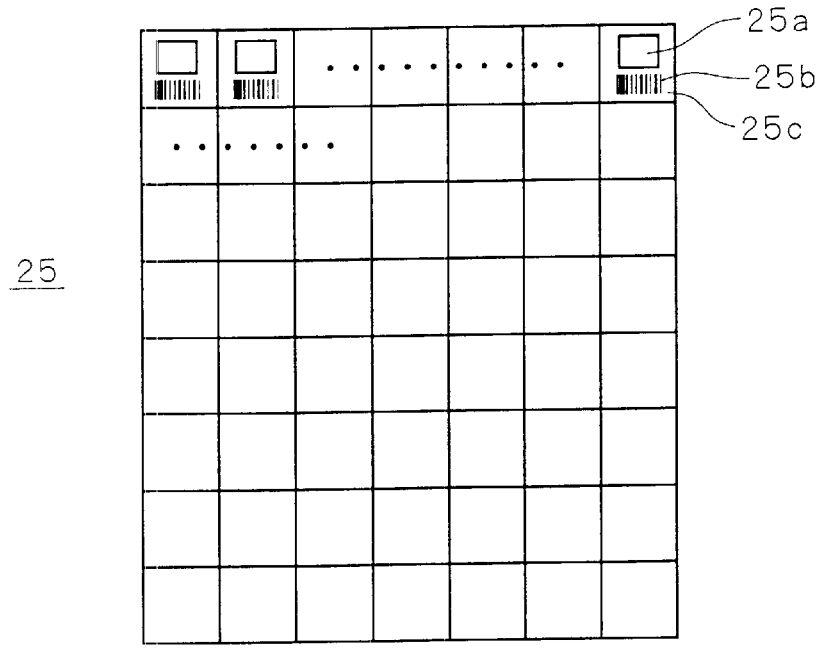
Figure 32:
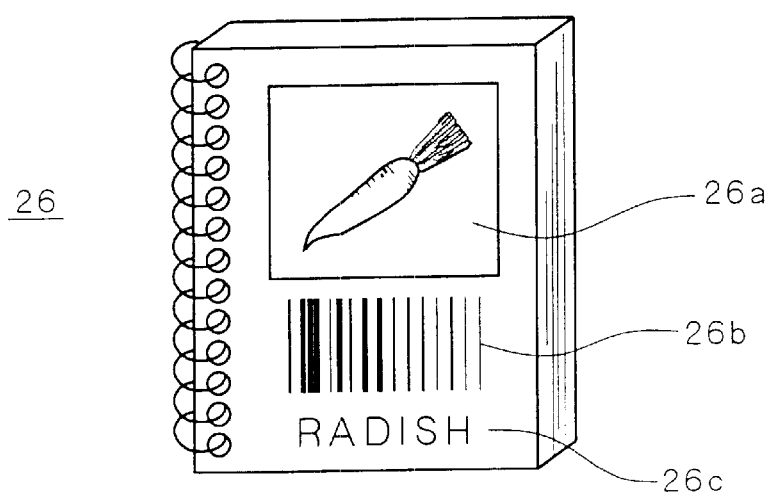

FIGS. 31 and 32 are conceptual diagrams showing separately-prepared bar-code lists 25 and 26, respectively.

The bar-code list 25 is a piece of sheet bearing a plurality of sets each of a drawing (or picture) 25a representing a food, a bar code 25b corresponding to the drawing 25a and its name 25c. The bar-code list 25 is especially advantageous for a case where a handheld bar-code reader 209 is provided separately from the refrigerator 200.

On the other hand, the bar-code list 26 is a booklet with a bunch of cards each bearing a drawing (or picture) 26a representing a food, a bar code 26b corresponding to the drawing 26a and its name 26c. The bar-code list 26 is suitable for both cases where a handheld bar-code reader 209 is used and the external reading faces 23a, 22a and 24a are used.

Furthermore, a technique that contents in the refrigerator can be grasped with weight sensed by a weight sensor provided in the refrigerator is disclosed in, for example, Japanese Patent Application Laid Open Gazette No. 6-68114. Also in this application, the weight sensor can be provided in the refrigerator 200.

Referring back to FIG. 30, the refrigerator compartment 201 has shelves 201a and 201b and a bottom 201c each having a weight sensor and a bottom 204d of the freezer 204 also has a weight sensor. Similarly, a bottom 203d of the drawer compartment 203 has a weight sensor. The doors 211 and 214 are provided with pockets 206 and 205, respectively, of which bottom portions can be provided with weight sensors. The weight sensors can operate under control of the semiconductor equipment 10 like the bar-code reader.

The weight sensor can sense an increase/decrease in weight of foods put thereon. Therefore, when the weight increases, it is grasped that the readings of the bar-code reader with this weight increase are data on the put-in foods. When the weight decreases, it is grasped that the readings of the bar-code reader with this weight decreases are data on the put-out foods. With this, it is possible to automatically distinguish putting-in and putting-out. Especially, when the foods are put in, the weights as well as the names and date are recorded.

Thus, associating the operation of the weight sensor with that of the bar-code reader, a complicated labor for putting-in and putting-out can be eased.

Figures 33, 34:
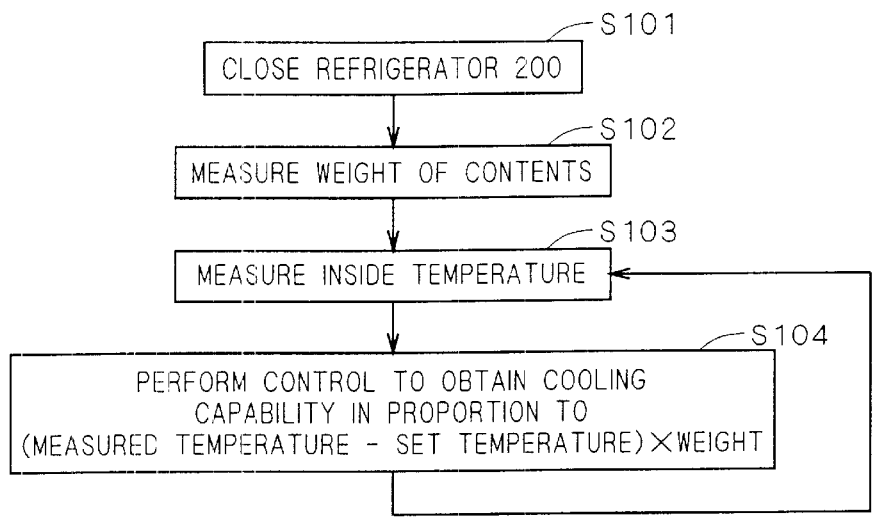
FIG. 33 is a flow chart showing an operation in accordance with the second application of the present invention.
FIG. 34 is a view showing a constitution in accordance with a third application of the present invention.

Further, usually, it is also desirable to control cooling capability of the refrigerator with a temperature sensor provided in the refrigerator. FIG. 33 is a flow chart showing a method of controlling the cooling capability of the refrigerator on the basis of the weight of contents and inside temperature. In the step S101, the refrigerator 200 is closed and then in the step S102, the weight of contents is measured. In the step S103, the temperature inside the refrigerator 200 is also measured. In the step S104, a value obtained by subtracting an inside temperature set from the measured temperature of the step S103 is multiplied by the weight of the contents of the step S102 and a control is made to achieve a cooling capability in proportion to the product. The control of the cooling capability is made by, for example, a controller 135 of the refrigerator shown in FIG. 25.

(C-3) The Third Application

By creating a database on contents of the refrigerator (hereinafter referred to as "stock database") and updating the stock database with change of the contents, the stock database can be utilized in various cases discussed later. In this application, an exemplary procedure of creating the stock database will be discussed.

FIG. 34 shows an exemplary stock database Q1. Items such as name of food, storage date (putting-in date), weight, number, open date and date for use are arranged in a horizontal direction and each item is generally termed "fields". In a vertical direction, various contents are arranged and each content is generally termed "records". Therefore, a row corresponds to a record and its items are arranged in different fields on the same row. As discussed above, the record is obtained by reading a bar code attached to a food. Further, these data may be obtained from delivery companies and retailers via network as discussed later.

Figure 35:
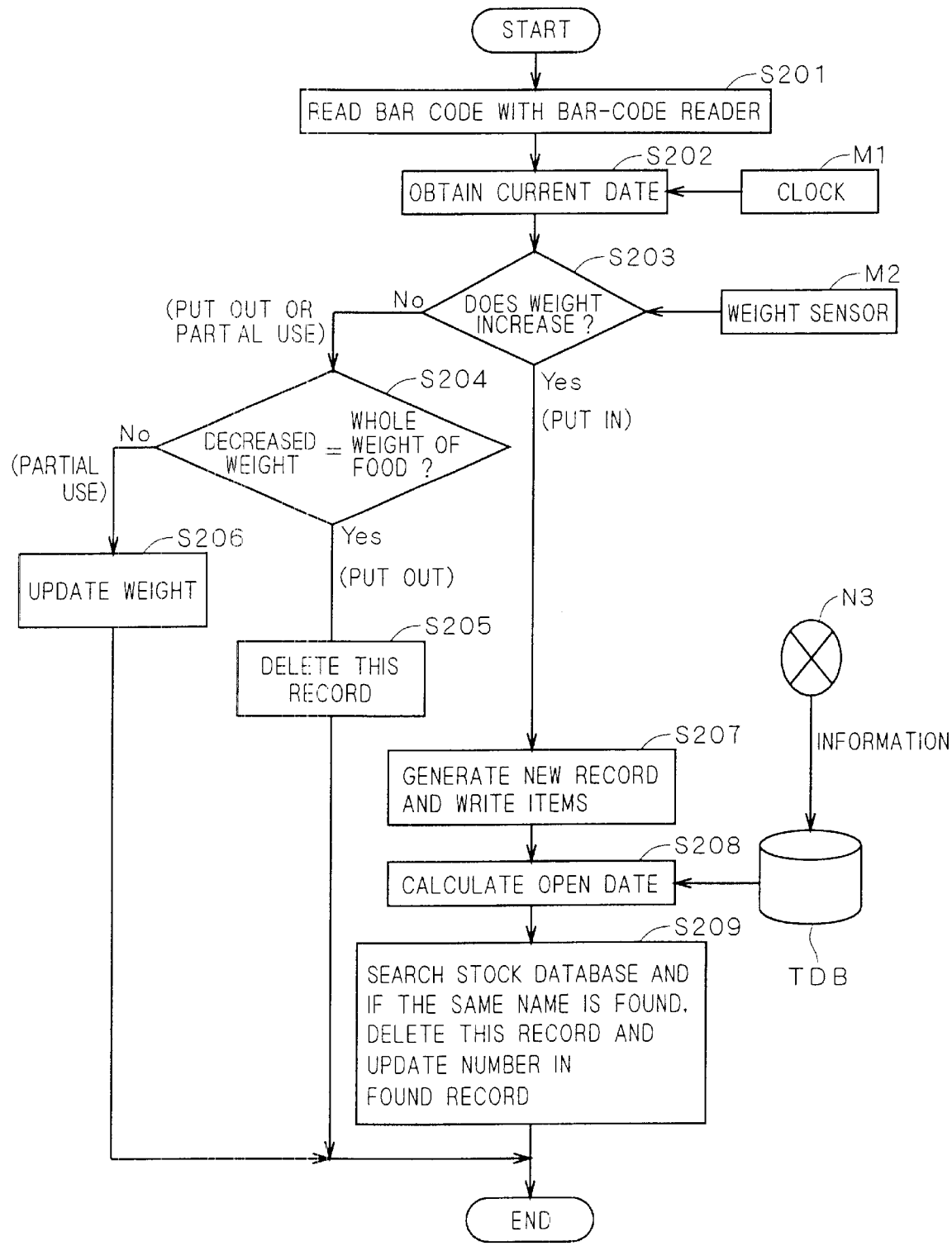
FIG. 35 is a flow chart showing a procedure in accordance with the third application of the present invention.

FIG. 35 is a flow chart showing a procedure of creating the stock database. The following control is made by the microprocessor 10x connected to the refrigerator through e.g., the bar-code reader controller 137, the I/O bus 134 and the memory bus 10e as shown in FIG. 25.

First, in the step S201, a bar code of an object is read by the bar-code reader without distinguishing an object to be stored and a stored object (that is, regardless of a judgment is made on whether putting-in or putting-out). Next, in the step S202, date is obtained. This date can be obtained from e.g., a clock M1 of the semiconductor equipment 10.

In the step S203, a judgment is made on whether the weight increases or decreases. This can be judged by an output from a weight sensor M2. When the weight decreases, it is grasped that putting-out or partially-use is made and the step S203 is followed by the step S204. When the weight increases, it is grasped that putting-in is made and the step S203 is followed by the step S207.

In the step S204, a judgment is made on whether or not the decrease in weight is the total weight of the food recognized in the step S201. The total weight of the food recognized in the step S201 can be grasped with reference to the stock database before update.

When it is judged that the decrease in weight is the total weight of the food in the step S204, it is grasped that putting-out is made. Therefore, in the step S205, the record of the food is deleted, completing creation and update of the stock database.

When it is judged that the decrease in weight is not the total weight of the food in the step S204, it is grasped that partially-use is made. Then, in the step S206, the item of weight for the food is updated, completing creation and update of the stock database.

In the step S207, a procedure for putting-in is made. In other words, a new record is created and field items, e.g., name, storage date and weight are written in the database. Subsequently, in the step S208, the open date for the food is calculated and written into the database. At this time, when the date of use for the food is already decided, there may be a case where a user can write the item of open date regardless of the calculation result in the step S208.

To calculate the open date, it is desirable that a preservable period database TDB is separately created, to be searched for information on the preservable period. The open date is obtained by adding the preservable period to the storage date. The preservable-period database TDB may be located wherever only if the microprocessor 10x can make an access thereto, and it is not necessary to locate the database TDB in the refrigerator. Further, It goes without saying that it is desirable to connect the preservable-period database TDB to a network N3 such as internet and always update with the latest information. It is natural that the preservable period of some foods may be different from general value. In this case, the contents of the preservable-period database TDB may be corrected by the microprocessor 10x. The corrected value can be used when a record for the same food is next created.

In the step S209, a judgment is made on whether or not a plurality of records for the same food name is checked. When the same record as the name recognized in the step S201 already exists, the number in the already-existing record is updated and the record created in the step S207 is deleted. This automatically update the item of number. After that, creation and update of the stock database is completed.

(C-4) The Fourth Application

Figure 36:
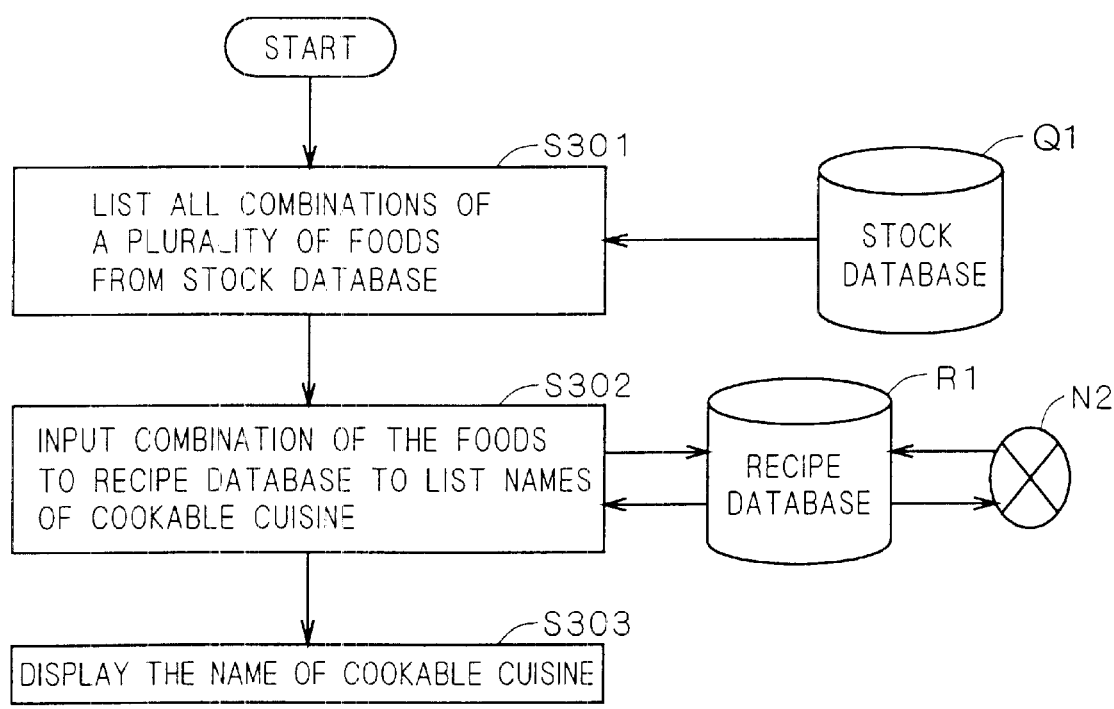
FIG. 36 is a flow chart showing a procedure in accordance with a fourth application of the present invention.
Figure 37:
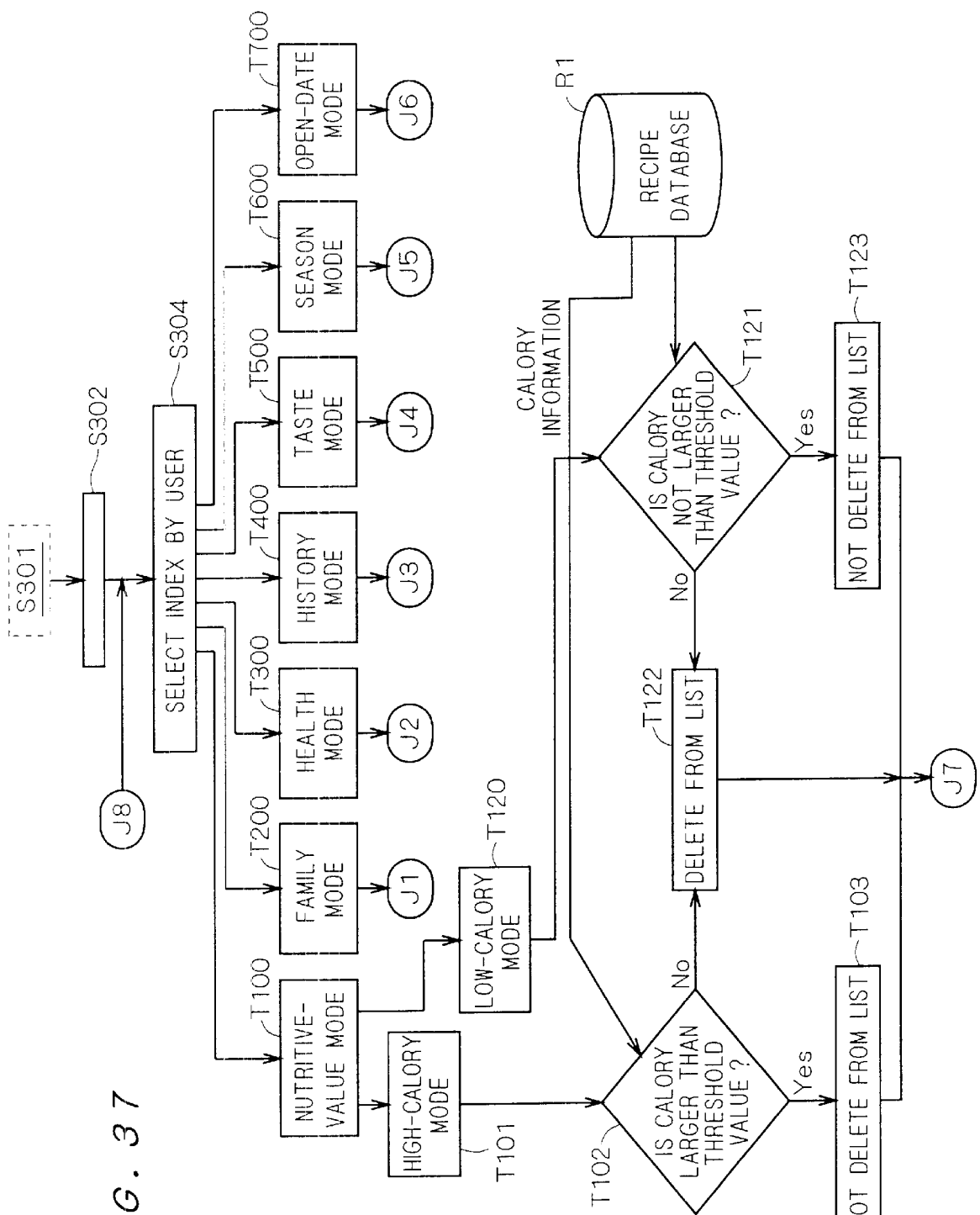
FIGS. 37 to 43 are flow charts showing procedures in accordance with a fifth application of the present invention.

FIG. 36 is a flow chart showing a method of this application. In this application, a method of proposing cuisines from a database will be discussed.

First, in the step S301, all combinations of a plurality of foods are listed from the stock database Q1. At this time, the food corresponding to a record whose date of use is already determined is omitted.

For example, when only potato and corn exist in the stock database Q1, this means that there exist potato and corn in the refrigerator which is an object of the stock database Q1 and the combinations listed in the step S301 are the following three; "only potato", "only corn" and "potato and corn".

Next, in the step S302, the above three combinations of foods are individually inputted into a recipe database R1 and names of cookable cuisines are listed. The recipe database R1 refers to a database in which names of cuisines and foods needed for cooking the cuisines (referred to as "foodstuffs") are associated with each other. In other words, foods and names of cookable cuisines from the foods are associated in the recipe database R1.

It is desirable to always update the recipe database R1, for example, through a network N2 such as internet. If the menus are stored in the ROM as disclosed in Japanese Patent Application Laid Open Gazette No. 63-65276, the kinds of cuisines cookable with a foodstuff is limited and not updated, and therefore users are likely to be wearied therewith.

In the recipe database R1, for example, "chips", "corn soup" and "salad" are found correspondingly to the foodstuffs "only potato", "only corn" and "potato and corn". These are displayed in the step S303. For example, the display can be achieved by using the LCD display 210 of FIG. 26, or using a display 10b of FIG. 14. Then, the users can select any of displayed cuisines.

Thus, without opening the refrigerator to check its contents, it is possible to easily know the cuisines cookable with foods contained therein.

Preferably, if recipes are also stored in the recipe database R1, the recipe for each cuisine can be displayed in the step S303 together with the foodstuff and cuisine.

Both the stock database Q1 and the recipe database R1 can be stored in a storage device such as the memory 10v of FIG. 25. Alternatively, the recipe database R1 may exist on the network N2. Further, when a plurality of refrigerators exist, a server controlling their respective stock databases Q1 may be provided. An administrator of the server recognizes the contents of the refrigerators. Further, the administrator of the server recognizes user's taste and potential demand. There may be a case where the administrator of the server should ask for permission, from the user, to know the contents of the refrigerators.

The flow chart of FIG. 36 can be executed on the basis of a software performed mainly by, for example, the microprocessor 10x of FIG. 25. This software can be loaded into computer-readable media such as a floppy disk and a CD-ROM attached/detached through the media ports 15 and 16, respectively. For example, the software attached in these media can be downloaded in the memory 10v through the I/O bus 134 by an operation of the media device controller 136.

The software can be supplied from an external network such as the network N2 of FIG. 36 through the I/O bus 134. In this case, the software can exist in predetermined carriers, for example, signals propagating in a network or modifying electric wave.

(C-5) The Fifth Application

In the fourth application, the number of combinations of foods listed in the step S301 is in proportion to a factorial of the number of records in the stock database, and the number of cuisines displayed in the step S303 increases. This application shows a technique to narrow the number of listed cuisines, reduce the time until the display of the cuisine and time needed for displaying the cuisine and facilitate user's selection of the cuisine.

This application will be discussed taking cases where "nutritive value", "family makeup", "condition of health", "history of cuisines made in the past", "user's taste", "foodstuffs in season", "open date" are used as indices to narrow the number of the cuisines.

FIGS. 37 to 43 are flow charts showing a method of selecting a cuisine in this application. The flow charts of FIGS. 37 to 43 can be executed on the basis of a software performed mainly by, for example, the microprocessor 10x of FIG. 25. This software can be loaded into computer-readable media such as a floppy disk and a CD-ROM attached/detached through the media ports 15 and 16, respectively, and further downloaded in the memory 10v. Furthermore, the software can be supplied from networks outside the refrigerator through the I/O bus 134 of FIG. 25. In this case, the software can exist in predetermined carriers.

After execution of the step S301 like in FIG. 36, in the step S302, the cuisines are listed, yet are not here displayed for the user.

Next, in the step S304, the user selects an index. For example, the above various indices are displayed for the user, who selects one of the indices. For example, the step S304 can be executed by using an apparatus in which a touch sensor is attached to the LCD display 210 or using the display 10b and the mouse 10d or the keyboard 10c shown in FIG. 14.

When the user selects "nutritive value" as the index, the step S304 is followed by the step T100 and the execution goes into a nutritive-value mode. Further, in the step T100, two more sub-modes are selected. A first sub-mode is a high-calory mode and a second sub-mode is a low-calory mode.

When the high-calory mode is selected in the step T100, the step T100 is followed by the step T101 then the step T102, where information of calory on each cuisine listed in the step S302 are inputted from the recipe database R1 and a judgment is made on whether the calory is higher than a threshold value (e.g., 1000 kcal) or not. When the calory of a cuisine is not higher than the threshold value, the step T102 is followed by the step T122, where the cuisine is deleted from the list made in the step S302. When the calory of a cuisine is higher than the threshold value, the step T102 is followed by the step T103, where the cuisine is not deleted from the list. The steps T122 and T103 are followed by the junction J7. The procedure after the junction J7 will be discussed later in a history mode referring to FIG. 40.

When the low-calory mode is selected in the step T100, the step T100 is followed by the step T120 then the step T121, where the information of calory on each cuisine listed in the step S302 are inputted from the recipe database R1 and a judgment is made on whether the calory is lower than the threshold value or not. When the calory of a cuisine is not lower than the threshold value, the step T121 is followed by the step T122, where the cuisine is deleted from the list made in the step S302. When the calory of a cuisine is lower than the threshold value, the step T121 is followed by the step T123, where the cuisine is not deleted from the list. The steps T122 and T123 are followed by the junction J7.

Figure 38:
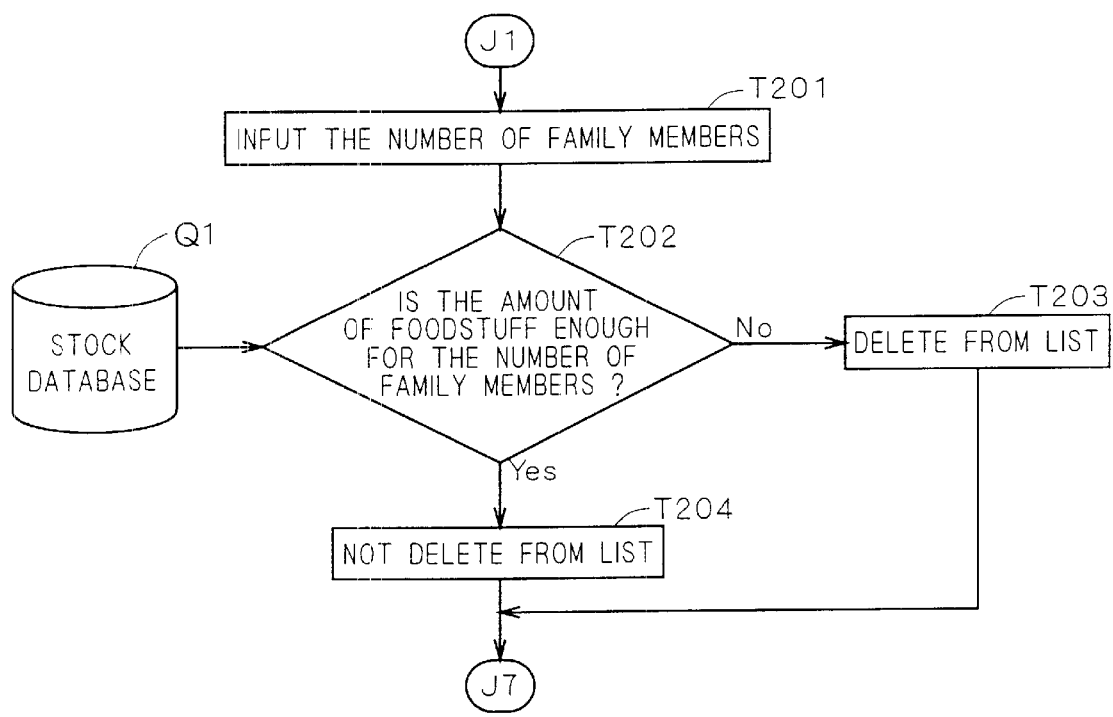

When the user selects "family makeup" as the index, the step S304 is followed by the step T200 and the execution goes into a family mode. FIG. 38 is a flow chart showing a procedure in the family mode and connected to the flow chart of FIG. 37 through a junction J1.

The step T200 is followed, through the junction J1, by the step T201, where the number of family members is inputted. This step is executed by using the mouse 10d or the keyboard 10c of FIG. 14.

In the step T202, a judgment is made on whether the amount of stock of the foodstuffs is enough for the number of family members or not. Information on the amount of stock is obtained from the stock database Q1. When the amount of stock of foodstuffs for a cuisine is not enough for the number of family members, the step T202 is followed by the step T203, where the cuisine is deleted from the list made in the step S302. When the amount of stock of foodstuffs for a cuisine is enough for the number of family members, the step T202 is followed by the step T204, where the cuisine is not deleted from the list made in the step S302. The steps T203 and T204 are followed by the junction J7.

Figure 39:
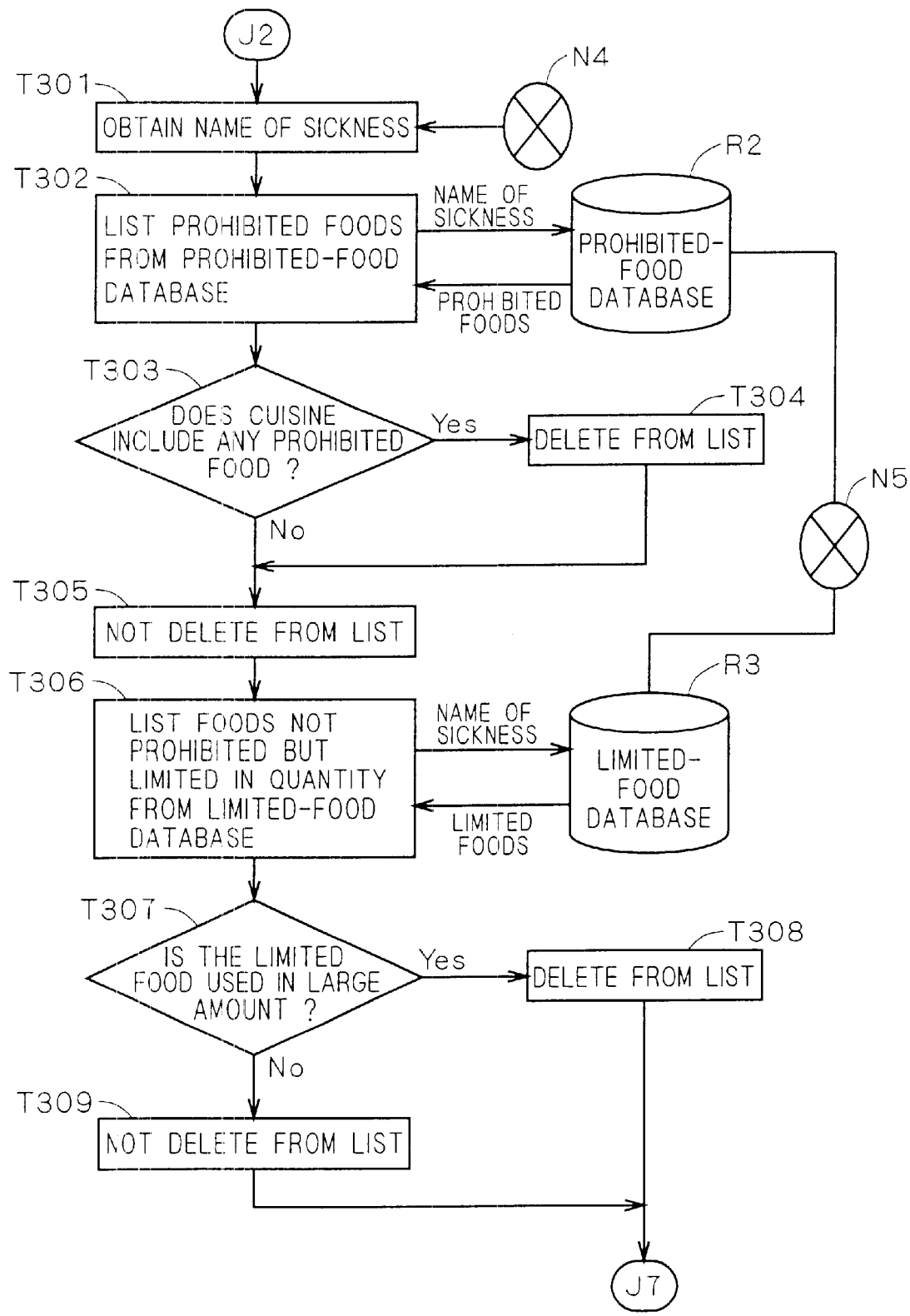

When the user or anyone of his (her) family is sick or under rehabilitation, a mode with index of "condition of health" is useful. When the index of "condition of health" is selected, in FIG. 37, the step S304 is followed by the step T300 and the execution goes into a health mode. FIG. 39 is a flow chart showing a procedure in the health mode and connected to the flow chart of FIG. 37 through a junction J2.

The step T300 is followed, through the junction J2, by the step T301, where the name of sickness of a patient or a person under rehabilitation is obtained. This step is executed by using the mouse 10d or the keyboard 10c of FIG. 14 or through a network N4 connected to a hospital.

In the step T302, prohibited foods for the sickness such as allergen foods for a specified allergy are listed from a prohibited-food database R2. The prohibited-food database R2 is obtained from a network N5 (or network N4) such as an internet.

Next, in the step T303, a judgment is made on whether the cuisines listed in the step S302 include the prohibited foods or not. When a cuisine includes the prohibited foods, the step T303 is followed by the step T304, where the cuisine is deleted from the list made in the step S302. When not include, the step T303 is followed by the step T305, where the cuisine is not deleted from the list.

Further, in the step T306 after both the steps T304 and T305, foods which are not prohibited but limited in quantity for the sickness, such as a food including much iodine for thyrosis, are listed from a limited-food database R3. The limited-food database R3 can be obtained from the network N4 or N5.

Next, in the step T307, a judgment is made on whether the limited foods are used in amount larger than a predetermined amount or not when a cuisine listed in the step S302 is made. When larger, the step T307 is followed by the step T308, where the cuisine is deleted from the list made in the step S302. When not larger, the step T307 is followed by the step T309, where the cuisine is not deleted. Both the steps T308 and T309 are followed by the junction J7.

Figure 40:
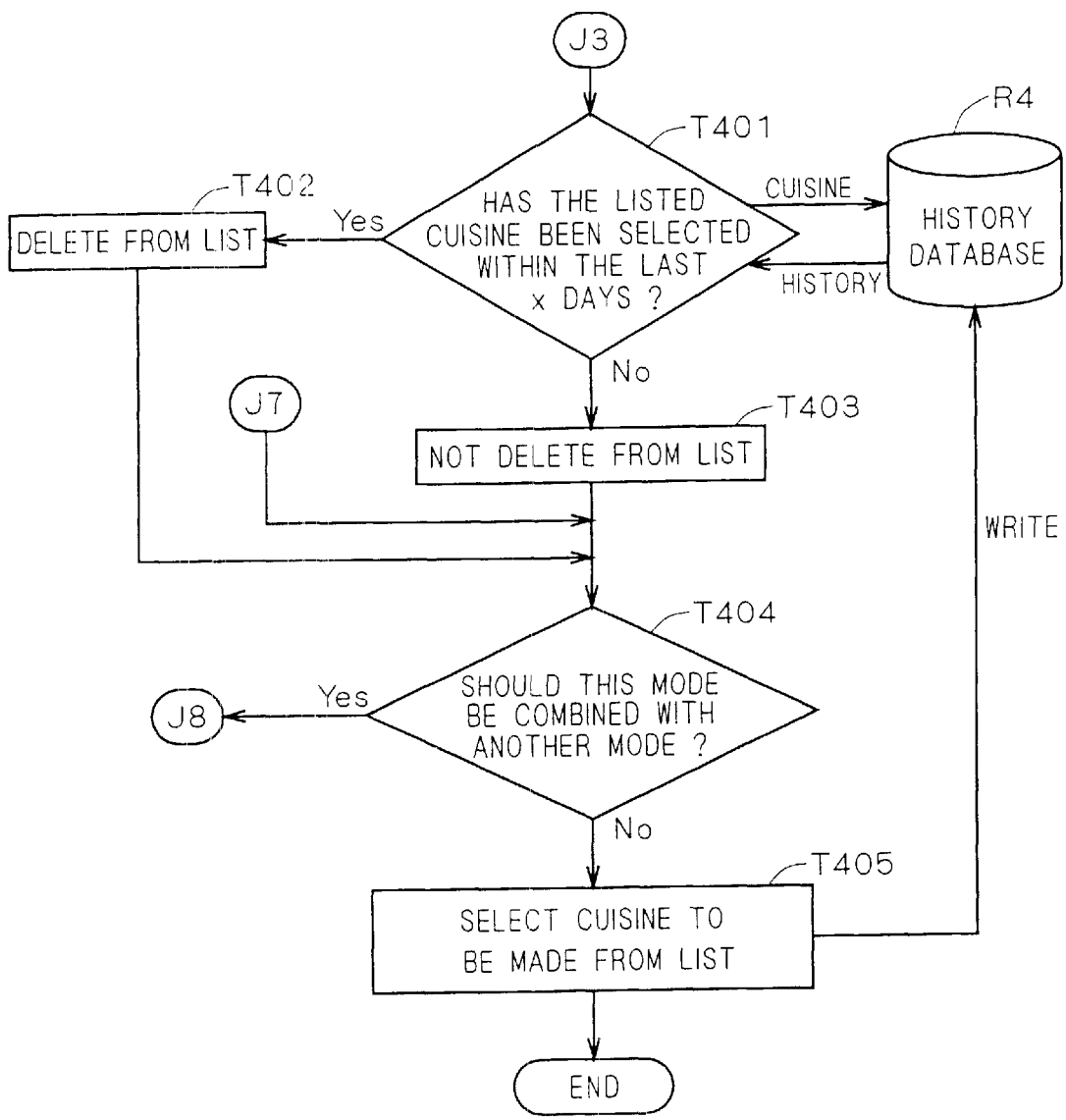

When the user selects "history of cuisine in the past" as the index, the step S304 is followed by in the step T400 and the execution goes into a history mode. In the history mode, referring to history of cuisines that the user recently ate, cuisines that the user has not much eaten recently are listed. FIG. 40 is a flow chart showing a procedure in the history mode and is connected to the flow chart of FIG. 37 through a junction J3.

The step T400 is followed, through the junction J3, by the step T401, where a judgment is made on whether the cuisines listed in the step S302 are selected or not within the last x days. Information referred to for this judgment is obtained from a history database R4. The history database R4 in which names of cuisines and date on which the cuisines are made are associated with each other can be stored in e.g., the memory 10v of FIG. 25 or a floppy disk attached/detached through the media port 15. Naturally, the history database R4 may exist on a network. The number x of days can be set by the user.

When it is judged, in the step T401, that a cuisine listed in the step S302 is selected within the last x days, the step T401 is followed by the step T402, where the cuisine is deleted from the list, and otherwise the step T401 is followed by the step T403 where the cuisine is not deleted.

Next, in the step T404, a judgment is made on whether this mode should be combined with another mode or not. When the number of the cuisines is further narrowed on the basis of another index, the step T404 is followed by the step S304 of FIG. 37 through the junction J8. When the number of the cuisines is not narrowed on the basis of another index, the step T404 is followed by the step T405, where the listed cuisines are displayed for the user and the user selects one of the cuisines to be made. The name of the selected cuisine is written into the history database R4, in association with the date on which the cuisine is made.

Further, the junction J7 shown in the nutritive mode, the family mode and the health mode is connected between the steps T403 and T404. Therefore, after the name of cuisine is deleted/not deleted from the list in these modes, the judgment of the step T404 is made through the junction J7.

Figure 41:
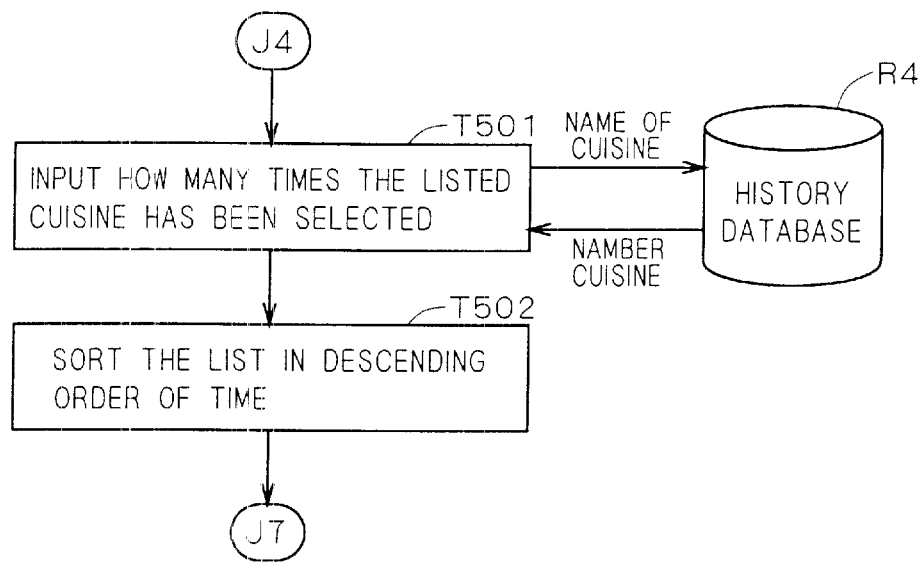

When the user selects "taste of user" as the index, the step S304 is followed by the step T500 and the execution goes into a taste mode. FIG. 41 is a flow chart showing a procedure in the taste mode and connected to the flow chart of FIG. 37 through a junction J4. In the taste mode, the recipes of high frequency in the history of the past are displayed in preference. For example, this mode may be set as a default mode for all other modes.

The step T500 is followed, through the junction J4, by the step T501, where how many times in the past each of the cuisines listed in the step S302 is selected is inputted. This number of times can be obtained from the history database R4. Then, in the step T502, the list is sorted in descending order of number of times. The step T502 is followed by the step T405 through the junction J7.

When the history mode or the taste mode which need the information on cuisines made in the past is not selected, it is not necessary to make the history database R4. Therefore, the step T405 of FIG. 40 can be omitted. In this case, like the step S303 of FIG. 36, the name of the cuisines left in the list are displayed.

Figure 42:
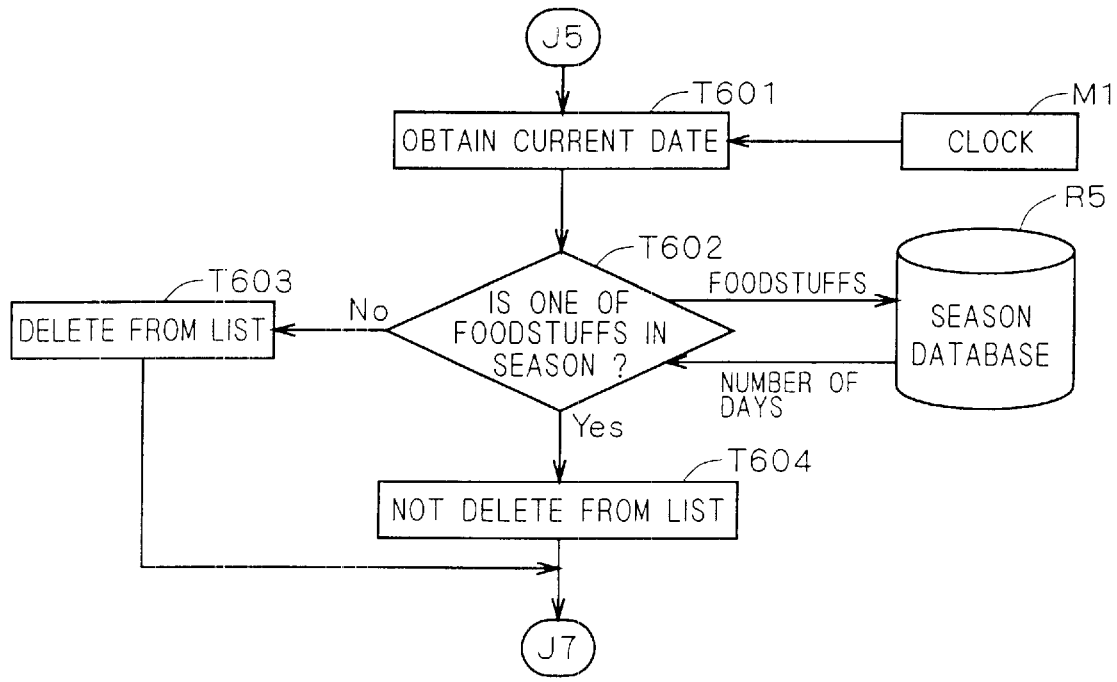

To display the foodstuffs in season in preference, the user may select "foodstuff in season" as the index. In this case, the S304 is followed by the step T600 and the execution goes into a season mode. FIG. 42 is a flow chart showing a procedure in the season mode and connected to the flow chart of FIG. 37 through a junction J5. The step T600 is followed, through the junction J5, by the step T601, where the current date is obtained from a clock M1. Then, in the step T602, a judgment is made on whether one of the foodstuffs used for the cuisines listed in the step S302 is in season or not. Information referred to for this judgment is obtained from a season database R5. The season database R5 in which names of foodstuffs and the seasons of the foodstuffs are associated with each other can be stored in e.g., the memory 10v of FIG. 25 or a floppy disk attached/detached through the media port 15. Naturally, the season database R5 may exist on a network.

When it is judged, in the step T602, that a foodstuff listed in the step S302 is not in season, the step T602 is followed by the step T603, where the name of the foodstuff is deleted form the list and when is in season, not deleted. Both the steps T603 and T604 are followed by the step T405 (of FIG. 40) through the junction J7.

Figure 43:
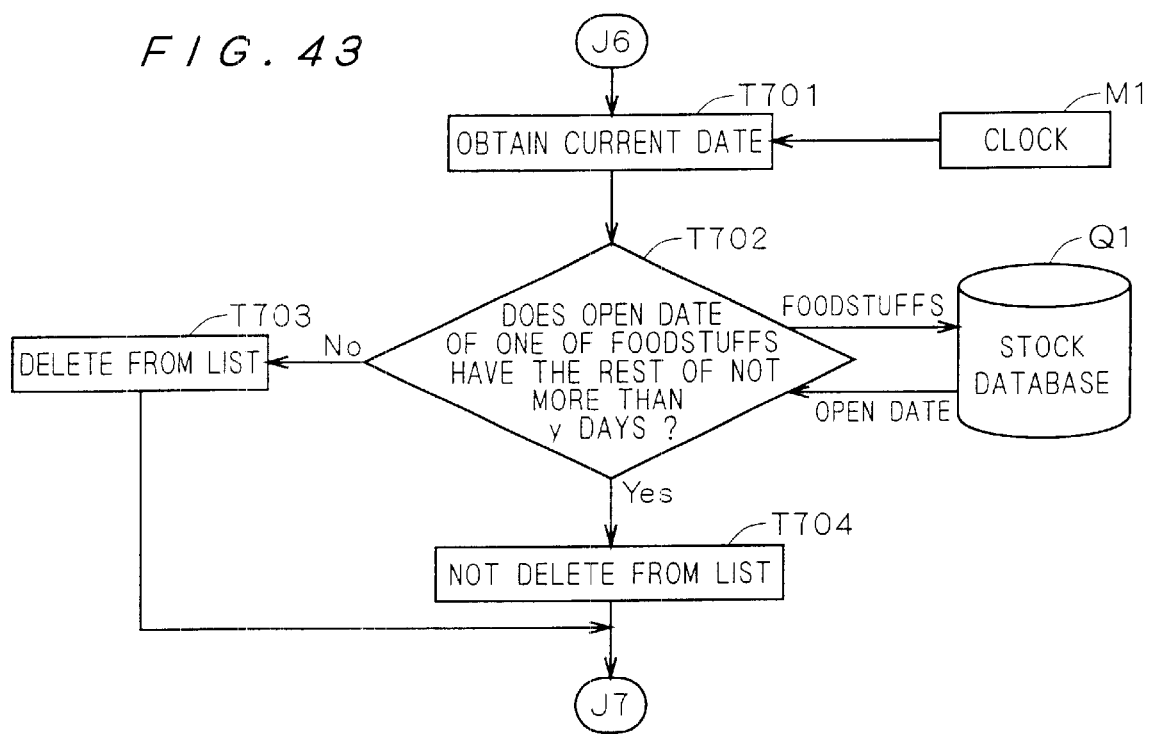

To display the cuisines using foodstuffs whose open date is close to end, the user can select "open date" as the index. In this case, the step S304 is followed by the step T700 and the execution goes into an open-date mode. FIG. 43 is a flow chart showing a procedure in the open-date mode and is connected to the flow chart of FIG. 37 through a junction J6. The step T700 is followed, through the junction J6, by the step T701, where the current date is obtained from a clock M1. Then, in the step T702, a judgment is made on whether the open date of one of the foodstuffs used for the cuisines listed in the step S302 has the rest of not more than y days or not. Information referred to for this judgment is obtained from the stock database Q1. The number y of days can be set by the user.

When it is judged, in the step T702, the open date of one of the foodstuffs used for a cuisine listed in the step S302 has the rest of not more than y days, the step T702 is followed by the step T703, where the cuisine is deleted from the list and otherwise the step T702 is followed by the step 1704, where the cuisine is not deleted. Both the steps T703 and T704 are followed by the step T405 (of FIG. 40) through the junction J7.

This open-date mode produces an effect of reducing the foodstuffs to be discarded over the open date.

(C-6) The Sixth Application

In this application, connection between home database and a foodstuff supplier's database will be discussed.

Figure 44:
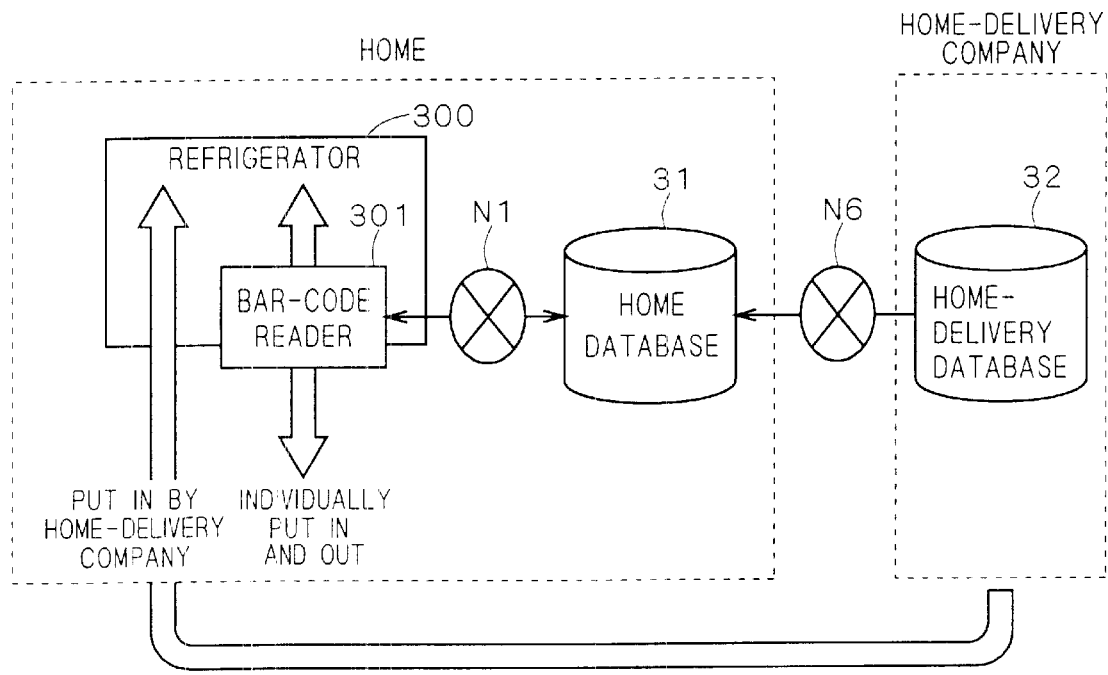
FIG. 44 is a block diagram showing a configuration in accordance with a sixth application of the present invention.

FIG. 44 is a block diagram showing a configuration of this application. In this figure, solid-line arrows indicate flows of information and a blank arrow indicates a physical distribution.

At home provided are a refrigerator 300, a home database 31 and the home network N1 interposed therebetween. The refrigerator 300 has, for example, a bar-code reader 301 with functions shown in the first and second applications. As the home database 31, the stock database Q1 shown in the third to fifth applications may be used.

A home-delivery company has a home-delivery database 32. The home-delivery database 32 is connected to the home database 31 through a network N6 across the border of home and the home-delivery company.

When the foods delivered by the home-delivery company are put in the refrigerator 300, since information on the foods can be transferred from the home-delivery database 32 to the home database 31, no labor to use the bar-code reader 301 is needed. Naturally, the foods which are not delivered by the home-delivery company but, for example, the user buys can be individually put in the refrigerator 300, using the barcode reader 301. When the foods are put out from the refrigerator 300, regardless of how the foods are bought, the bar-code reader 301 is used.

Figure 45:
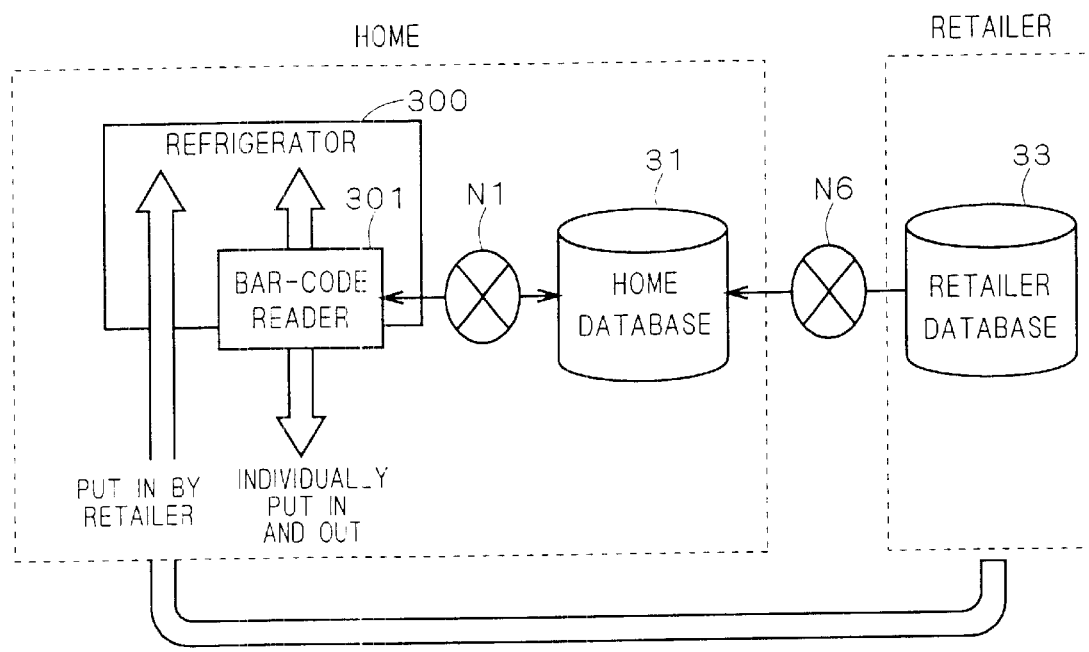
FIG. 45 is a block diagram showing another configuration in accordance with the sixth application of the present invention.

FIG. 45 is a block diagram showing another configuration of this application. The configuration of FIG. 45 is different from that of FIG. 44 in that a retailer, instead of the home-delivery company, is connected to home through the network N6. In many cases, the retailer does not deliver foods and the user brings the foods to home. There is, however, another difference between the configurations of FIGS. 45 and 44.

Specifically, in many cases, since the retailer adopts a POS (Point Of Sales) system, the POS database is used as a retailer database 33 and this almost eliminates a read operation of a bar code when the foods are put into the refrigerator 300 at home. Therefore, a function of putting-in/putting-out of the bar-code reader 301 may be omitted. Naturally, in this case, a not-controlled putting-in may be allowed so that foods bought from shops not having the retailer database 33 may be put in the refrigerator 300. In other words, the not-controlled putting-in of foods is in an off-line state for the network N6. The putting-out may be also in the off-line state.

According to this application, among the fields of the stock database Q1, the field of open date can be easily obtained from the home-delivery database 32 or the retailer database 33 through the network N6.

(C-7) The Seventh Application

Figure 46:
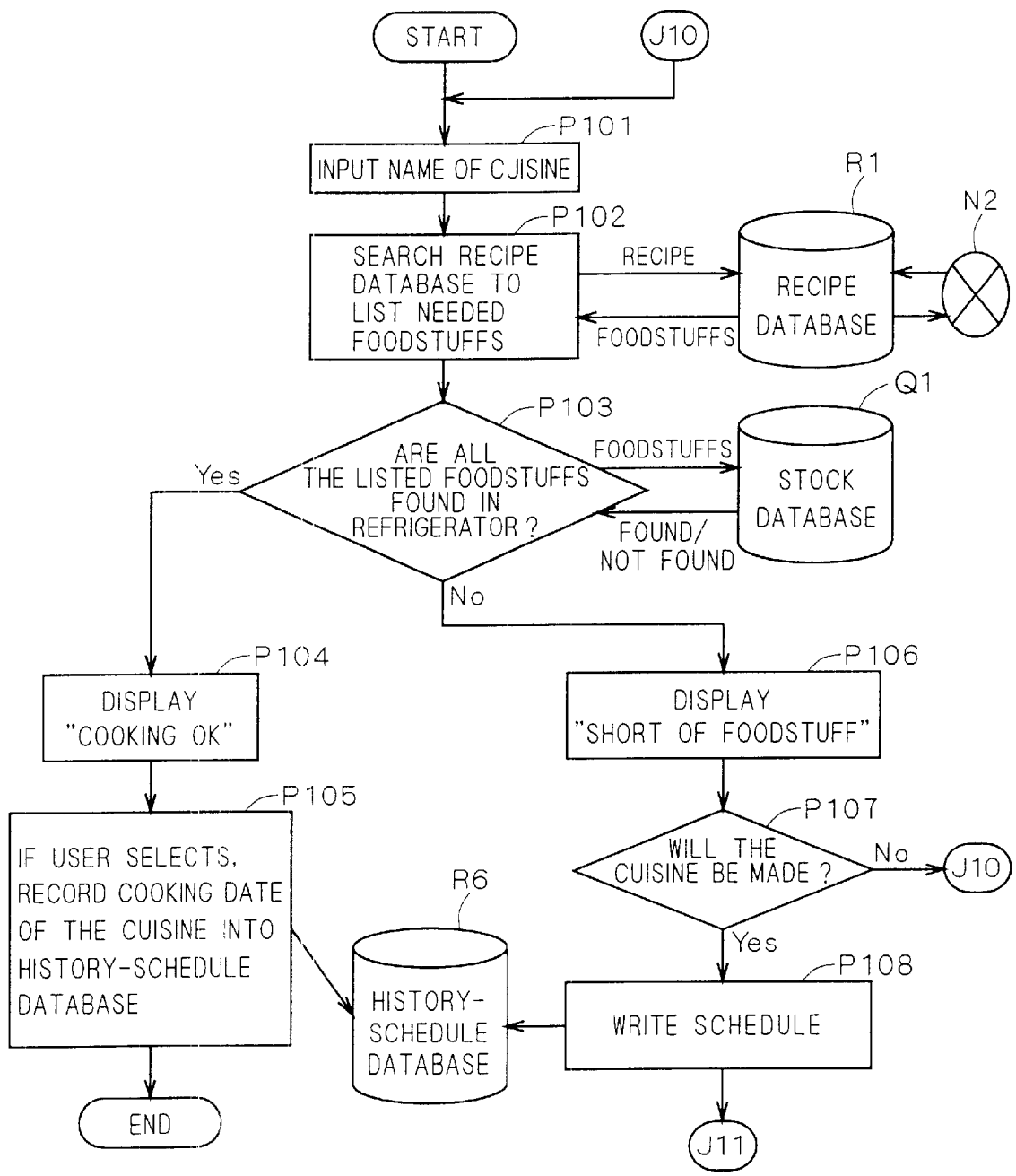
FIGS. 46 and 47 are flow charts showing procedures in accordance with a seventh application of the present invention.
Figure 47:
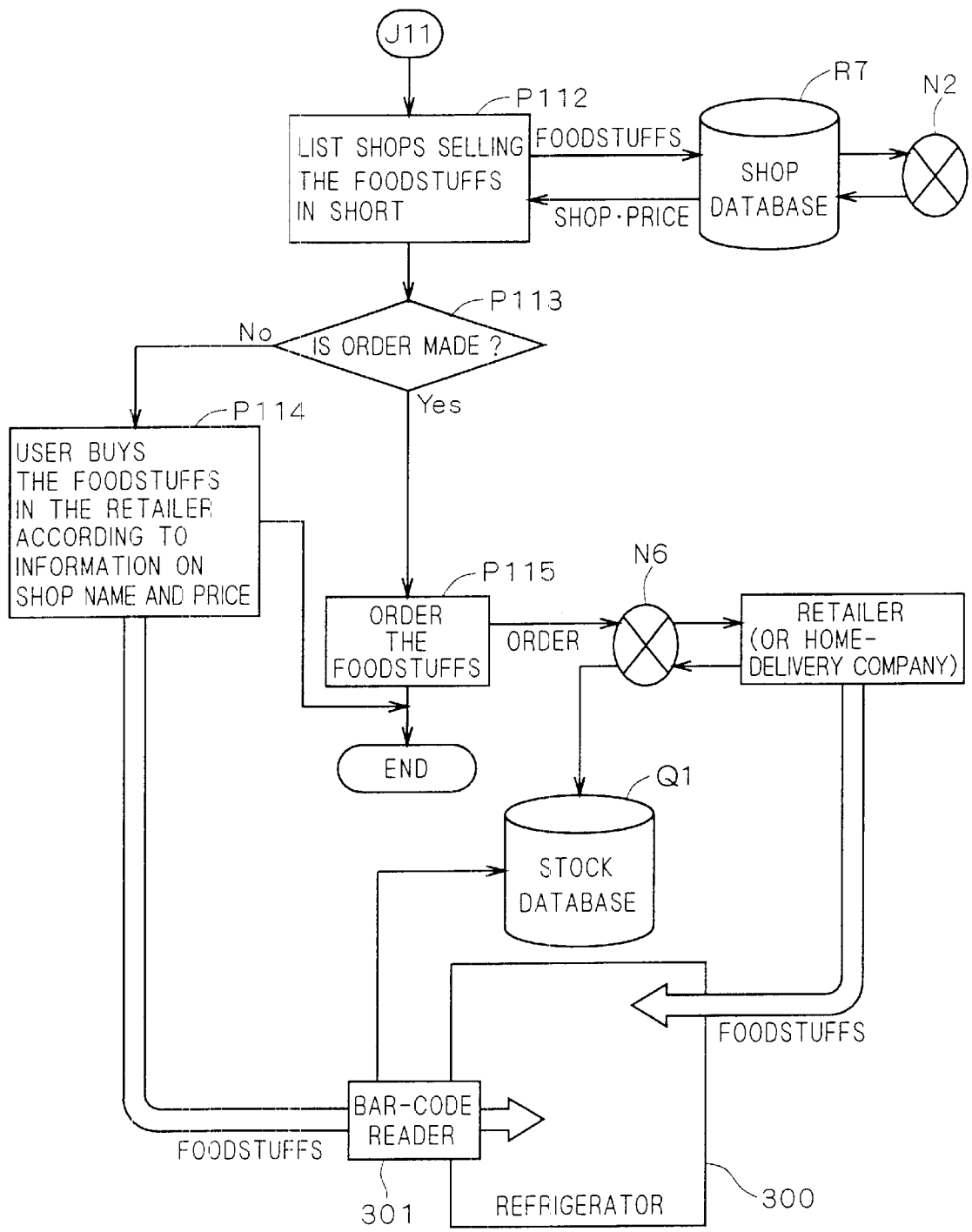

FIGS. 46 and 47 are flow charts showing this application, being connected to each other through a junction J11.

Referring to FIG. 46, in the step P101, the name of a cuisine which the user want to make is inputted. This step can be executed by input operation with the mouse 10d or the keyboard 10c of FIG. 14. Subsequently, in the step P102, the recipe database R1 is searched to list the foodstuffs needed for the cuisine inputted in the step P101. As discussed in the fourth application, it is desirable that the recipe database R1 is connected to the network N2 and occasionally updated by data distributed therefrom.

Next, in the step P103, a judgment is made on whether the listed foodstuffs are found in the refrigerator or not on the basis of the stock database Q1. When all the listed foodstuffs are found, the step P103 is followed by the step P104, where an indication of "Cooking OK" is given to the user. This step may be executed by using the LCD display 210 of FIG. 26 or the display 10b of FIG. 14.

After that, in the step P105, when the user selects it, a cooking date of the cuisine is inputted and the recipe and the cooking date are stored in a history-schedule database R6, in association with each other. That completes the procedure.

On the other hand, when it is judged, in the step P103, that the foodstuffs are in short, the step P103 is followed by the step P106, where an indication of "short of foodstuff" is given to the user. Then, in the step P107, the user is asked if this cuisine will be made. This step can be executed by a display of "Will you make this cuisine?" with the display 10b of FIG. 14 and input operation with the mouse 10d and the keyboard 10c.

When the cuisine will be made, in the step P108, a cooking date of the cuisine is inputted and the recipe and the cooking date are stored in the history-schedule database R6, in association with each other, like in the step P105. The step P108 is followed by the step P112 through the junction J11. When the cuisine will not be made, the step P107 is followed by the step P101 through the junction J10.

Referring to FIG. 47, in the step P112, a shop database R7 is searched to list shops selling the foodstuffs in short. In the shop database R7, foodstuffs, shops selling the foodstuffs, prices of the foodstuffs in the shops are stored, in association with one another. It is also desirable that the shop database R7 is connected to the network N2 and occasionally updated by data distributed therefrom.

Next, in the step P113, the user is asked if an order will be made to the listed shop. When the user answers that the order will be made, the step P113 is followed by the step P115, where an order is made to a retailer or a home-delivery company through, for example, the network N6 of FIGS. 44 and 45. Then, the retailer or the home-delivery company makes an access to the stock database Q1 as shown in the sixth application and stores predetermined information, such as the name of foodstuff and its open date. The foodstuff itself is put in the refrigerator 300 as indicated by the blank arrow. After end of the step P115, the procedure of this application is completed.

On the other hand, in the step P113, when the user answers that an order will not be made, the user buys the foodstuff in the retailer according to the name of shop and price information (in the step P114). This step P114 is not executed by software. After that, the procedure of this application is completed. As to the foodstuff that the user buys in the retailer, predetermined information is stored in the stock database Q1 by reading its bar code with the bar-code reader 301. The foodstuff itself is put in the refrigerator 300.

Thus, according to this application, it can be grasped whether the cuisine that the user requires is cookable with foods existing in the refrigerator or not and further what is in short among the needed foodstuffs, and furthermore the user can know the price of the foodstuff. As required, the foodstuffs in short can be ordered on the spot.

The flow charts of FIGS. 46 and 47 can be executed on the basis of a software mainly by the microprocessor 10x FIG. 25 except for the step P114. This software can be loaded into computer-readable media such as a floppy disk and a CD-ROM attached/detached through the media ports 15 and 16, respectively, and further downloaded in the memory 10v. Furthermore, the software can be supplied from networks outside the refrigerator through the I/O bus 134. In this case, the software can exist in predetermined carriers.

(C-8) The Eighth Application

Figure 48:
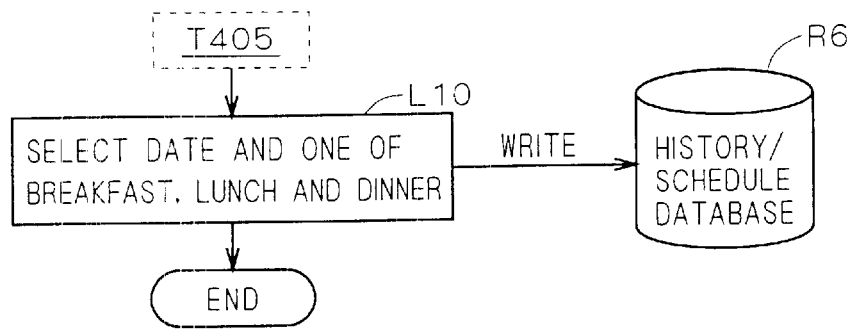
FIGS. 48 and 49 are flow charts showing procedures in accordance with an eighth application of the present invention.
Figure 49:
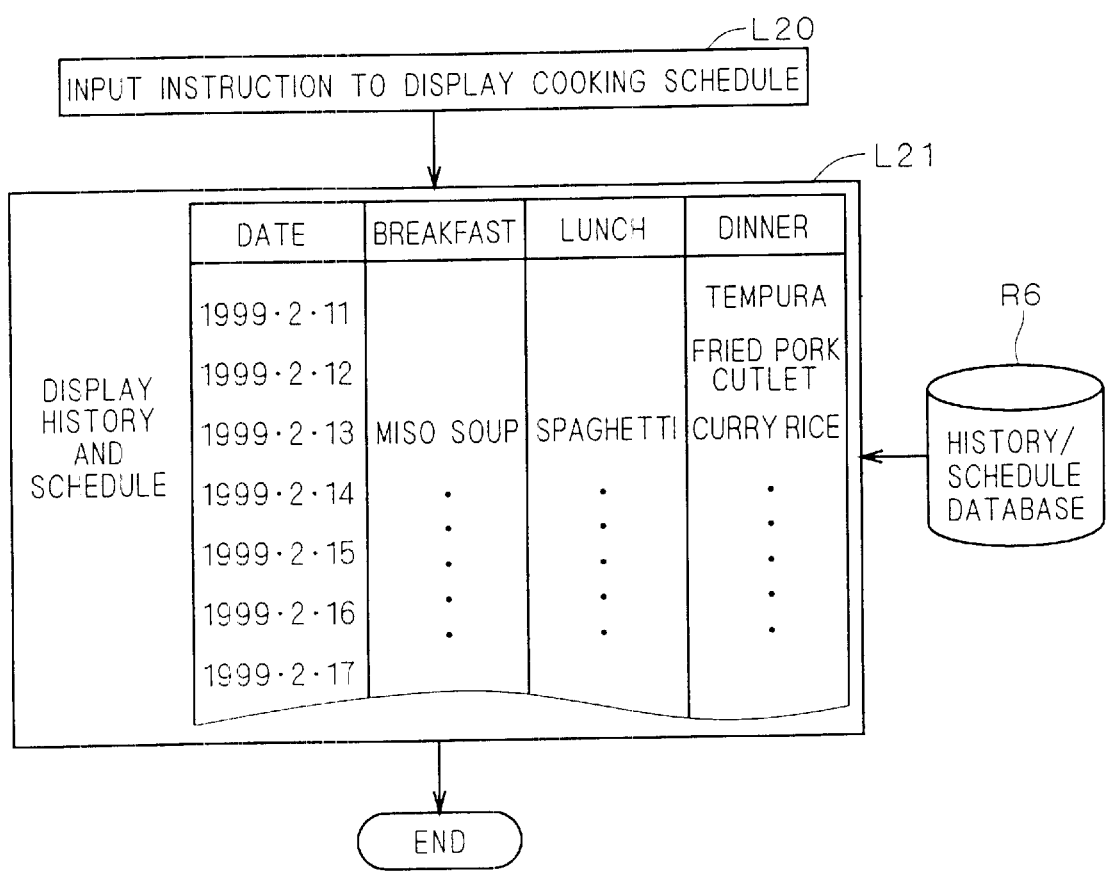

FIGS. 48 and 49 are flow charts showing a procedure of this application. A step L10 of FIG. 48 can be executed after the step T405 of FIG. 40, and steps L20 and L21 of FIG. 49 are executed independently from the procedures of FIGS. 36 to 43.

Referring to FIG. 48, in the step T405, with respect to the selected cuisine to be made, the cooking date or/and for which the cuisine will be made, breakfast, lunch or dinner are inputted. The step can be executed by input operation using the mouse 10d or the keyboard 10c of FIG. 14. The inputted data are written into the history-schedule database R6.

Referring to FIG. 49, in the step L20, an instruction to display cooking schedule is inputted. The step can be also executed by input operation using the mouse 10d or the keyboard 10c of FIG. 14. Then, in the step L21, contents of the history-schedule database R6 are displayed. This step may be executed by using LCD display 210 of FIG. 26 or the display 10b of FIG. 14. Thereby obtained is a list in which the cooking date, breakfast, lunch, dinner and the name of cuisine are arranged correspondingly, as attached in the step L21.

Thus, it becomes possible to control daily menu schedule and foods in the refrigerator in association with each other and manifestly grasp days on which the menu has not been decided.

Figure 50:
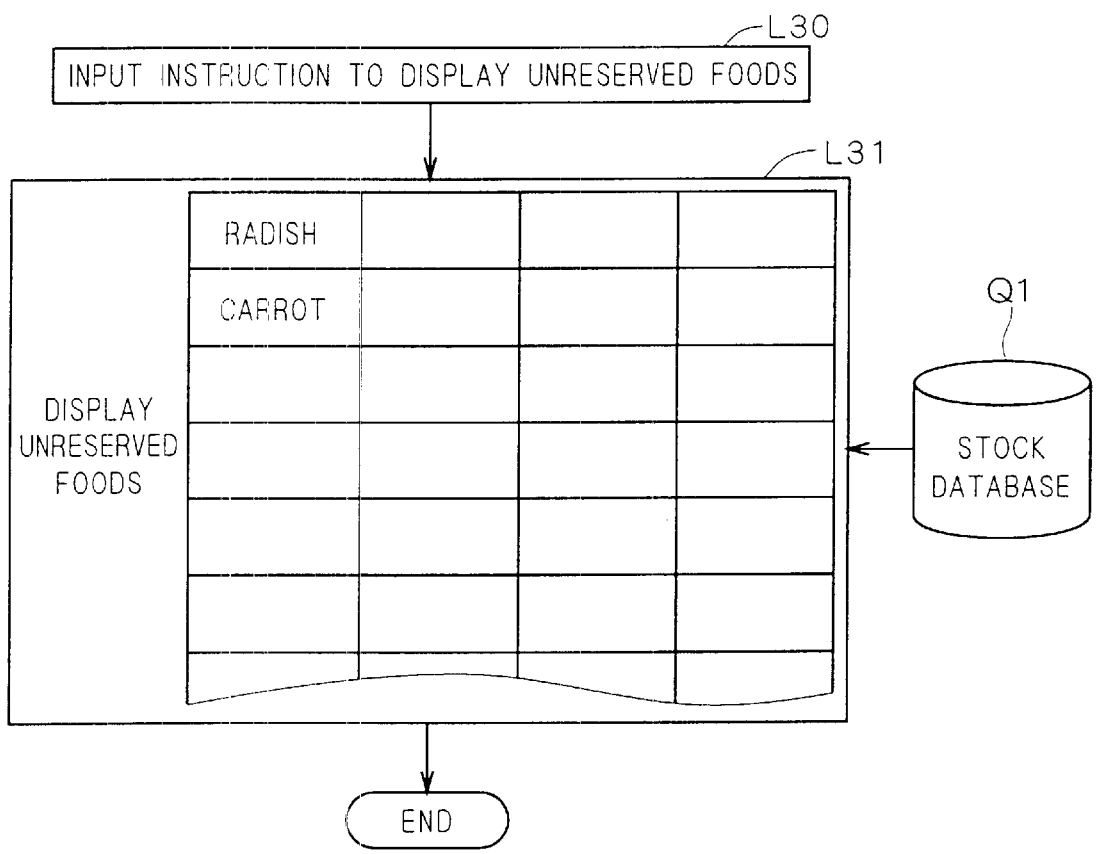
FIG. 50 is a flow chart showing a variation of the procedure in accordance with the eighth application of the present invention.

FIG. 50 is a flow chart showing a variation of this application. Steps L30 and L31 of FIG. 50 are also executed independently from the procedures of FIGS. 36 to 43.

In the step L30, an instruction to display foods which are not used nor have no plan to be used, that is, unreserved foods, is inputted. The step can be also executed by input operation using the mouse 10d or the keyboard 10c of FIG. 14. After that, in the step 131, the unreserved foods are displayed on the basis of the stock database Q1. This step may be executed by using the LCD display 210 of FIG. 26 or the display 10b of FIG. 14. Thereby obtained is a list of unreserved foods as attached in the step L31.

Thus, it becomes possible to easily grasp foods having no plan to be used and efficiently use the contents of the refrigerator.

(C-9) The Ninth Application

Figure 51:
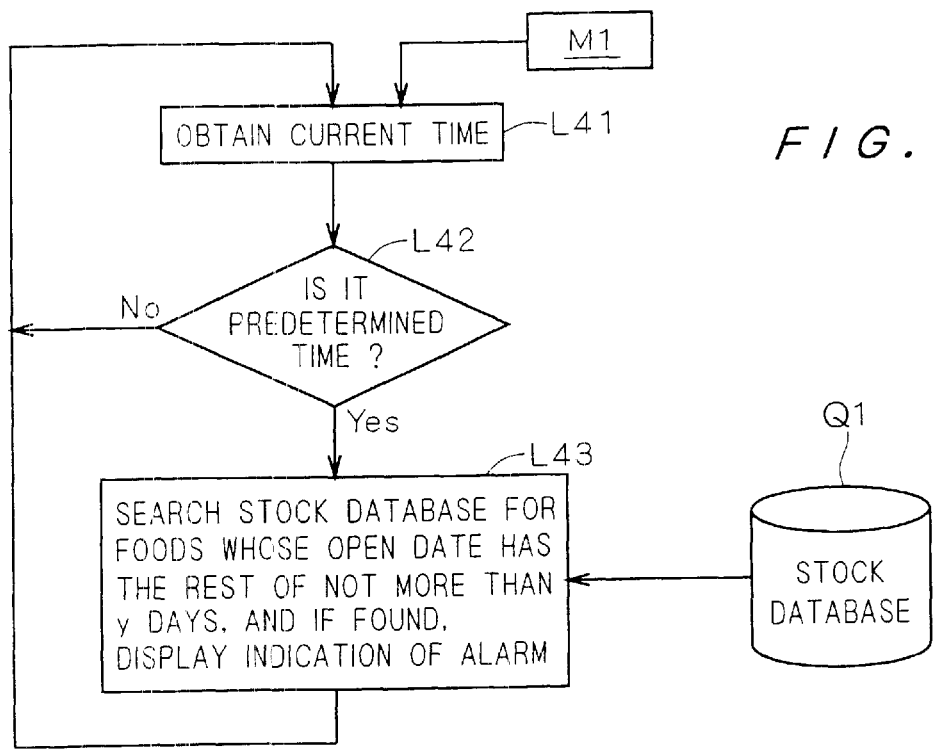
FIG. 51 is a flow chart showing a procedure in accordance with a ninth application of the present invention.
Figure 52:
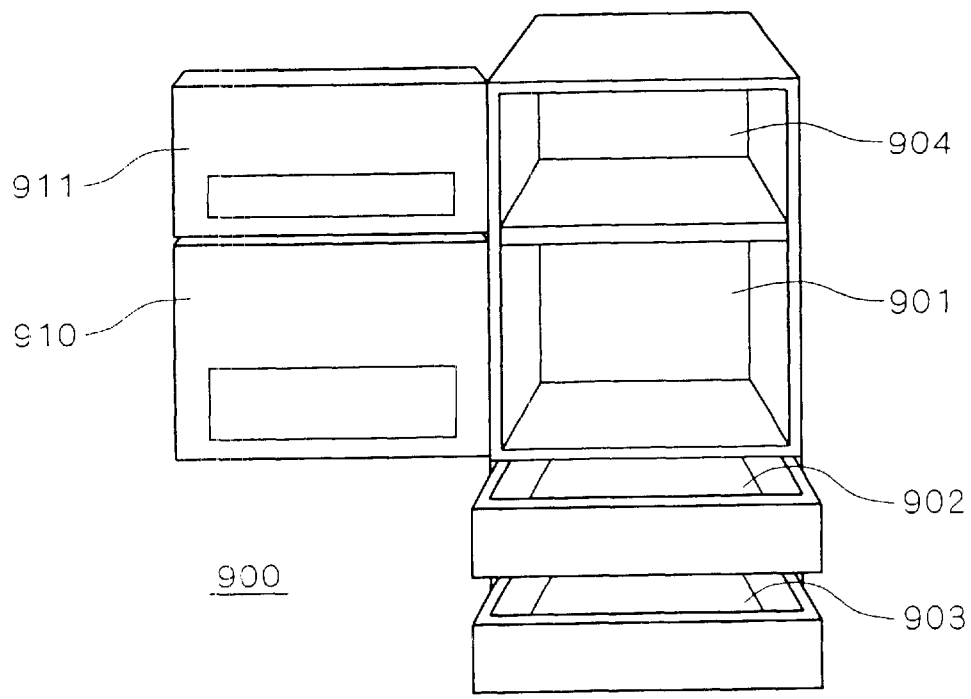
FIG. 52 is an external view showing a background art.

FIG. 51 is a flow chart showing a procedure of this application. Since the main procedure of this application is the step L43 which is repeated every predetermined time, this procedure may be executed independently from or in parallel with other procedures.

In the step L41, similarly to the step S202 of FIG. 35, the current time is obtained from the clock M1. In the step L42, a judgment is made on whether the current time is the predetermined time or not. The step L42 is followed by the step L43 when the current time is the predetermined time, and followed by the step L41 when not.

In the step L43, the stock database Q1 is searched for foods whose open date having the rest of not more than y days, and when such a food is found, an indication of alarm is given. After that, the step L43 is followed by the step L41. Like in the step T702, the number y of days can be set by the user.

Naturally, as mentioned above, in a course from the steps L42 and L43 back to the step L41, other procedures may be executed.

Thus, since the content of the refrigerator whose open date is close to end is periodically displayed without entering the open-date mode of the third application, this application produces an effect of allowing the user such a convenient use of the refrigerator as not to deteriorate the quality of foods in the refrigerator.

While the invention has been shown and described in detail, the foregoing description is in all aspects illustrative and not restrictive. It is therefore understood that numerous modifications and variations can be devised without departing from the scope of the invention.

What is claimed is:

1. A semiconductor equipment, comprising:

clock generation means for simultaneously generating separate first and second clocks, said second clock having a frequency higher than that of said first clock;

a processing unit operating on the basis of either one of said first clock and said second clock and having a semiconductor device; and a switch for switching between said first and second clocks depending on a temperature the semiconductor equipment is operating in and for transmitting either one of said first clock and said second clock to said processing unit, wherein the switch switches to the first clock when the semiconductor equipment is operating at room temperature and switches to the second clock when the semiconductor equipment is operating while it is being cooled.

2. The semiconductor equipment according to claim 1, wherein the switch comprises a temperature sensor, which automatically switches to the first clock when the semiconductor equipment is operating at room temperature and switches to the second clock when the semiconductor equipment is operating while it is being cooled.

3. A semiconductor equipment, comprising:

a phase locked loop circuit receiving a reference clock having a reference frequency, for multiplying said reference frequency to generate a multiple clock, and making an alignment in phase between a divided result of said multiple clock by a predetermined value and said reference clock; and a processing unit operating on the basis of said multiple clock and having a semiconductor device, wherein said predetermined value becomes larger as temperature becomes lower.

4. A semiconductor equipment, comprising:

a first clock generation unit for generating a first clock;

a second clock generation unit for generating a second clock having a frequency higher than that of said first clock;

a processing unit operating on the basis of either one of said first clock and said second clock and having a semiconductor device; and a switch for switching between said first and second clocks depending on a temperature the semiconductor equipment is operating in and for transmitting either one of said first clock and said second clock to said processing unit, wherein the switch switches to the first clock when the semiconductor equipment is operating at room temperature and switches to the second clock when the semiconductor equipment is operating while it is being cooled.

5. The semiconductor equipment according to claim 4, wherein the switch comprises a temperature sensor, which automatically switches to the first clock when the semiconductor equipment is operating at room temperature and switches to the second clock when the semiconductor equipment is operating while it is being cooled.

* * * * *

UNITED STATES PATENT AND TRADEMARK OFFICE
CERTIFICATE OF CORRECTION

PATENT NO. : 6,519,963 B2
DATED : February 18, 2003
INVENTOR(S) : Maeda

It is certified that error appears in the above-identified patent and that said Letters Patent is hereby corrected as shown below:

<u>Title page,</u>
Item [45], and the Notice information should read as follows:

-- [45] **Date of Patent: \*Feb. 18, 2003**

[\*] Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Seventeenth Day of June, 2003

JAMES E. ROGAN
*Director of the United States Patent and Trademark Office*